(12) United States Patent
Song et al.

(10) Patent No.: US 12,423,056 B2
(45) Date of Patent: Sep. 23, 2025

(54) MULTIPLY-ACCUMULATE UNIT

(71) Applicant: ANAFLASH INC., San Jose, CA (US)

(72) Inventors: Seung-Hwan Song, Palo Alto, CA (US); Sang-Soo Lee, Cupertino, CA (US); Sihwan Kim, San Francisco, CA (US)

(73) Assignee: Anaflash Inc., San Jose, CA (US)

( * ) Notice: Subject to any disclaimer, the term of this patent is extended or adjusted under 35 U.S.C. 154(b) by 876 days.

(21) Appl. No.: 17/022,137

(22) Filed: Sep. 16, 2020

(65) Prior Publication Data

US 2021/0081175 A1 Mar. 18, 2021

Related U.S. Application Data

(60) Provisional application No. 62/901,270, filed on Sep. 17, 2019.

(51) Int. Cl.
*G06F 7/544* (2006.01)
*G06G 7/16* (2006.01)
*G11C 16/04* (2006.01)
*G11C 16/24* (2006.01)
*G11C 16/26* (2006.01)

(52) U.S. Cl.
CPC ............ *G06F 7/5443* (2013.01); *G06G 7/16* (2013.01); *G11C 16/0433* (2013.01); *G11C 16/24* (2013.01); *G11C 16/26* (2013.01)

(58) Field of Classification Search
CPC ......... G06F 7/5443; G06F 17/16; G06G 7/16; G06N 3/065; G11C 16/0433; G11C 16/24; G11C 16/26
See application file for complete search history.

(56) References Cited

U.S. PATENT DOCUMENTS

| | | | | |
|---|---|---|---|---|
| 5,350,953 | A * | 9/1994 | Swenson | G06N 3/063 706/41 |
| 8,773,887 | B1 * | 7/2014 | Naji | G11C 11/1693 365/158 |
| 9,754,203 | B2 * | 9/2017 | Di Castro | G06G 7/163 |
| 10,497,442 | B1 * | 12/2019 | Kumar | G06N 3/08 |
| 2016/0048755 | A1 * | 2/2016 | Freyman | G06F 17/11 365/185.05 |
| 2018/0075337 | A1 * | 3/2018 | Buchanan | G11C 13/0007 |
| 2018/0253643 | A1 * | 9/2018 | Buchanan | G06F 7/5443 |

(Continued)

OTHER PUBLICATIONS

M. Kim et al., "A 68 Parallel Row Access Neuromorphic Core with 22K Multi-Level Synapses Based on Logic-Compatible Embedded Flash Memory Technology," 2018 IEEE International Electron Devices Meeting (IEDM), San Francisco, CA, USA, 2018, pp. 15.4.1-15.4.4, doi: 10.1109/IEDM.2018.8614599. (Year: 2018).*

*Primary Examiner* — Carlo Waje

(57) ABSTRACT

An analog multiplier accumulator array comprises analog multipliers organized in a matrix of rows and columns, each of the multiplier comprising one or more than one analog input signal line coupled to the analog multipliers in a row of the array; an analog level sensing circuit; a set of bit lines, each bit line electrically connected to the analog multiplier in each column of the row; and an analog accumulator configured to connect the set of the bit lines to an analog level sensing circuit for generating digital output signals, wherein an access transistor connected to the analog input line and a variable resistor form the analog multiplier.

17 Claims, 25 Drawing Sheets

(56) References Cited

U.S. PATENT DOCUMENTS

| | | | | |
|---|---|---|---|---|
| 2019/0164044 A1* | 5/2019 | Song | ............... | G11C 16/0408 |
| 2020/0160160 A1* | 5/2020 | Kim | ..................... | G06N 3/08 |
| 2020/0311533 A1* | 10/2020 | Agrawal | ............ | G11C 13/003 |
| 2022/0276837 A1* | 9/2022 | Fujinami | ............... | G06N 3/065 |

* cited by examiner

MULTIPLY-ACCUMULATE UNIT

CROSS-REFERENCE TO RELATED APPLICATION

This application is based on and claims the benefit of U.S. Provisional Application Ser. No. U.S. 62/901,270, filed on Sep. 17, 2019, entitled Multiply-Accumulate Unit, to which a claim of priority is hereby made and the disclosure of which is incorporated by reference. This invention generally relates to a multiplier circuit and, more particularly, to an improved multiplier circuit implemented with analog circuits.

BACKGROUND OF THE INVENTION

Multiply-Accumulator (MAC) circuits for multiplying digital signals usually have been very complex and large. Also, real-time MAC typically requires an "on the fly" process for effectively generating computed outputs based on real-time input data. On the other hand, Flash memory can be a very useful form of nonvolatile data storage on the integrated circuit. However, Flash memory must be programmed before running the circuit and cannot be updated while running the MAC computation due to its slow programming speed and limited availability of reprogramming. Therefore, the data stored in Flash memory shall be static during the MAC computation.

FIG. 1 is a simplified functional block diagram of a conventional MAC array. The MAC array 100 is widely used for digital signal processing, communication, networking, and neural network. This conventional fully digital-based MAC unit comprises digital multipliers, digital adders, and digital accumulator. Each sub-unit includes multi-digital gates in combination with a plurality of transistors. The MAC array 100 is fed from the data input bus D_IN_BUS to receive digital input data. Data outputs from the MAC array are connected to the data output bus D_OUT_BUS. For a single MAC involved operation, each digit of one operand (from D_IN_BUS) is multiplied by each digit of the other operand (also from D_IN_BUS) to form partial products; these results are then added. Then, those added products sequentially are forwarded to the digital accumulator and carried out via D_OUT_BUS. This conventional MAC array 100 typically requires a relatively large number of transistors, thus takes up a fair amount of chip area when fabricated on an integrated circuit, and the areal density is not efficient. In processing a single MAC operation, each digital logic signal requires a full VDD-GND swing and every single wire in the MAC array carries only a single bit. Thus, the conventional MAC array consumes a relatively large amount of power inefficiently. For this technical limit, the goal of integrated circuit developers is to find ways to realize a multiplier with more efficient and simple circuit elements.

FIG. 2 is a simplified functional block diagram of the electronic synapse circuit for analog operation. This MAC array 200 includes a plurality of non-volatile synapse cells (NV Synapse) organized in a matrix of rows and columns. A plurality of word lines WL 2, WL1 and WL0 each are electrically connected to each non-volatile synapse cell in a respective row. A plurality of reference lines SL2, SL1 and SL0 each are electrically connected to each non-volatile synapse cell in a respective row. Two pairs of complementary bit lines BL0/BLB0 and BL1/BLB1 each are connected to each non-volatile cell synapse in a respective column. A sensing circuit supplies a differential pair of currents in the bit lines to each of the synapse cells in a respective row. Four transistors (two pairs of CS0/CS1) connect the sensing circuit to the synapse cells and enable or disable current flows ($I_{BL}$, $I_{BLB}$) in the differential pairs of bit lines between each non-volatile synapse and the sensing circuit.

Even if not shown, as a multiplier/accumulator circuit, each non-volatile synapse is configured to receive one input as a first operand X and uses the stored value (parameter) as a second operand Y. The non-volatile synapse can be implemented using the aforementioned Flash memory to store the second operand Y. This stored second operand Y can represent a filter coefficient or weight parameters in conjunction with a particular synapse. Each non-volatile synapse generates the partial product from the operands X and Y, and then the resulting partial products are summed up in the corresponding bit lines. The sensing circuit at the end of two pairs of the two complementary bit-lines amplifies the small voltage difference between the complimentary analog inputs (BL0/BLB) to a normal logic level. Given that a second stored operand Y is static, this architecture cannot support real-time MAC computation where the value of the operand needs to be updated in real-time. Therefore, the MAC computation is only available from the given synapse cells in the array that have those pre-programmed parameter values.

This limits the available computation capability within the given synapse array size. For example, if the MAC array has 1 million synapses, then the available parameter counts are limited to no more than 1 million since each synapse can store only 1 parameter value at the moment. In the neural network application, therefore, this traditional array structure is not efficient for the deep and larger models and also for the training purpose, since the available operand counts are limited due to the long program time of the synapse cell.

SUMMARY OF INVENTION

This invention discloses a multiplier circuit and, more particularly, an improved multiplier circuit implemented with analog circuits.

According to the present invention, an analog multiplier accumulator array, comprising: analog multipliers organized in a matrix of rows and columns, each of the multiplier comprising: one or more than one analog input signal line coupled to the analog multipliers in a row of the array; an analog level sensing circuit; a set of at least one bitline, each bit line electrically connected to the analog multiplier in each column of the row; and an analog accumulator configured to connect the bit line to an analog level sensing circuit for generating digital output signals, wherein an access transistor connected to the analog input line and a variable resistor form the analog multiplier.

In one embodiment, the variable resistor comprising: one or more than one flash memory wherein at least one flash memory is configured to connect to a first analog input line and the access transistor has a gate terminal connected to a second analog input line.

In another embodiment, the variable resistor comprising: one read transistor; and a pair of coupling transistors configured to have a common floating gate with the read transistor, wherein the coupling transistor is coupled to an input line separate from the analog input line connected to the access transistor.

In another embodiment, the analog multiplier further comprises a switching transistor connected to the access transistor in series, the switching transistor having a gate terminal connected to a digital input line.

In another embodiment, the switching transistor is connected to the variable resistor in series such that the switching transistor enables or disables a flow of current in the bit line to the variable resistor.

In another embodiment, the variable resistor comprising: one or more than one flash memory wherein at least one flash memory is configured to connect to a first analog input line and the access transistor has a gate terminal connected to a second analog input line.

Also, as another embodiment, the variable resistor comprising: one read transistor; and a pair of coupling transistors configured to have a common floating gate with the read transistor, one of the coupling transistors is connected to a program word line and the other one of the coupling transistors is connected to a write word line.

In another embodiment, the program word line is connected to a control gate of one of the coupling transistors and a write word line is connected to the other one of the coupling transistors.

In another embodiment, the analog accumulator comprising: an array of MOS transistors in a row, each connected to a bit line in the set of bit lines; and one control line connected to a gate of the MOS transistor for activating a switching of the MOS transistors such that currents flowing in the connected bit lines are allowed to be merged in one of the connected bit lines when the MOS transistors are activated.

Also, in another embodiment, the analog accumulator comprising: an array of CMOS transistors in a row, each connected to a bit line in the set of bit lines; and a pair of control lines connected to a gate of NMOS forming the CMOS transistor and a second source node is connected to a gate of PMOS forming the CMOS transistor such that currents flowing in the connected bit lines are allowed to be merged in one of the connected bit lines when the NMOS, PMOS, or NMOS and PMOS is activated.

Also, as another embodiment, the analog accumulator comprises an array of pairs of PMOS transistors forming a current mirror in a row, each pair of PMOS transistors comprising: a first and second transistors in a pair having a common node connected to gates of the paired transistors, wherein the first transistor has a drain terminal connected to the common node and the second transistor has a drain terminal for outputting an amplified currents with reference to the current flowing in the bitline connected to the common node.

According to the present invention, the analog multiplier accumulator array, comprising: analog multipliers organized in a matrix of rows and columns, each of the multiplier comprising: a pair of analog input signal lines coupled to the analog multipliers in a row of the array; an analog level sensing circuit; a set of bit lines, each bit line electrically connected to the analog multiplier in each column of the row; and an analog accumulator configured to connect the set of the bit lines to an analog level sensing circuit for generating a digital output signal, wherein one pair of differential transistors, a variable resistor, and a switching transistor form the analog multiplier.

In another embodiment, a first of the differential transistor has a gate coupled to a first of the paired analog input signal line, the first transistor being associated with a first of the bit lines, and a second of the differential transistor has a gate coupled to a second of the paired analog input line, the second transistor being associated with a second of the bit lines.

In another embodiment, the switching transistor circuit comprises a pair of MOS transistors connected to the pair of differential transistors in series.

In another embodiment, the variable resistor comprising: one read transistor forming the analog multiplier, and a pair of coupling transistors connected to the read transistor in that the coupled transistors have a common floating gate connected to a gate terminal of the read transistor, wherein the common source terminal of the differential transistors is connected to a drain terminal of the read transistor.

In another embodiment, the analog multiplier accumulator array further comprising: a sign selection circuit having four transistors configured in that gate terminals of first and second transistors are connected to one of complementary digital input signal lines and gate terminals of third and fourth transistors are connected to receive the other of the complementary digital input signals, wherein the paired analog input signals are allowed to be associated to either a pair of the first and second transistors in the sign selection circuit or a pair of the third and fourth transistors in the sign selection circuit.

In another embodiment, the analog accumulator comprising: an array of MOS transistors in a row, each connected to a bit line in the set of bit lines; and one control line connected to a gate of the MOS transistor for activating a switching of the MOS transistors such that currents flowing in the connected bit lines are allowed to be merged in one of the connected bit lines when the MOS transistors are activated.

In another embodiment, the analog accumulator comprising: an array of CMOS transistors in a row, each connected to a bit line in the set of bit lines; and a pair of control lines connected to a gate of NMOS forming the CMOS transistor and a second source node is connected to a gate of PMOS forming the CMOS transistor such that currents flowing in the connected bit lines are allowed to be merged in one of the connected bit lines when the NMOS, PMOS, or NMOS and PMOS is activated.

Also, as another embodiment, the analog accumulator comprises an array of pairs of PMOS transistors forming a current mirror in a row, each pair of PMOS transistors comprising: a first and second transistors in a pair having a common node connected to gates of the paired transistors, wherein the first transistor has a drain terminal connected to the common node and the second transistor has a drain terminal for outputting an amplified currents with reference to the current flowing in the bit line connected to the common node.

BRIEF DESCRIPTION OF THE DRAWINGS

Features of the present invention will become apparent to those skilled in the art from the following description with reference to the drawings. Understanding that the drawings depict only typical embodiments of the invention and are not, therefore, to be considered limiting in scope, the invention will be described with additional specificity and detail through the use of the accompanying drawings, in which.

DETAILED DESCRIPTION OF THE INVENTION

In the following description, certain embodiments of the present invention will be described. For purposes of explanation, specific configurations and details are set forth in order to provide an understanding of the embodiments. However, it will also be apparent to one skilled in the art that the present invention may be practiced without the specific details. Furthermore, well-known features inherently a part of the invention and rudimentary to those having skill in the art are generally omitted or simplified in order not to obscure the embodiment being described. Further details of the present invention are described as follows with respect to the drawings.

Figure 1:
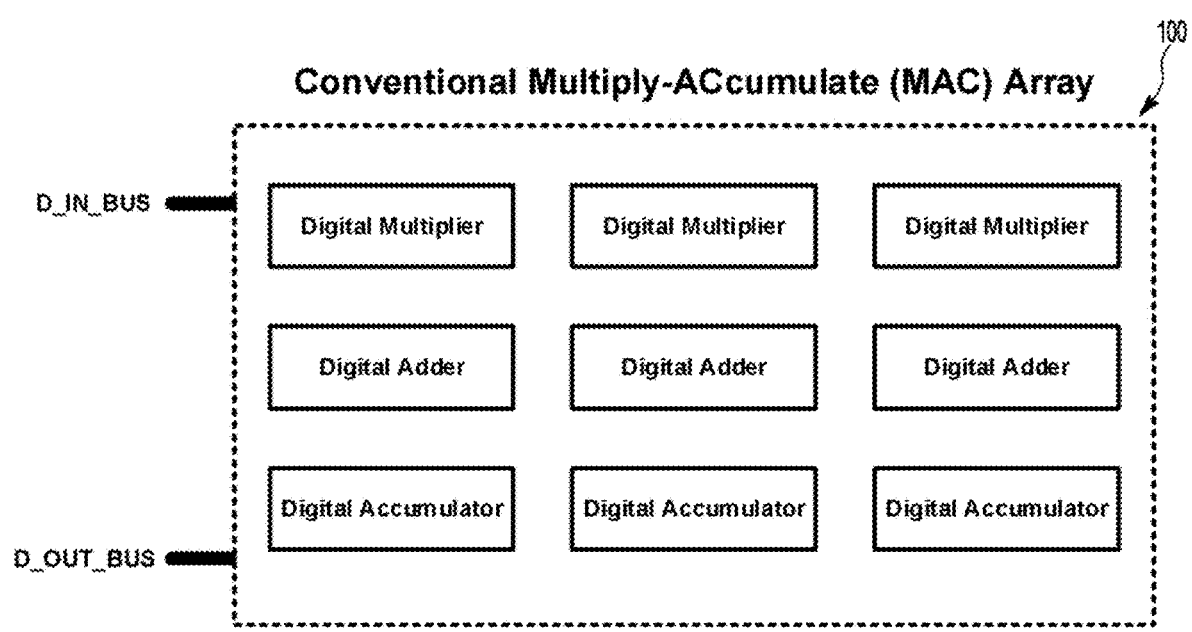
FIG. 1 is a simplified functional block diagram of a conventional Multiply-Accumulator (MAC) array.
Figure 2:
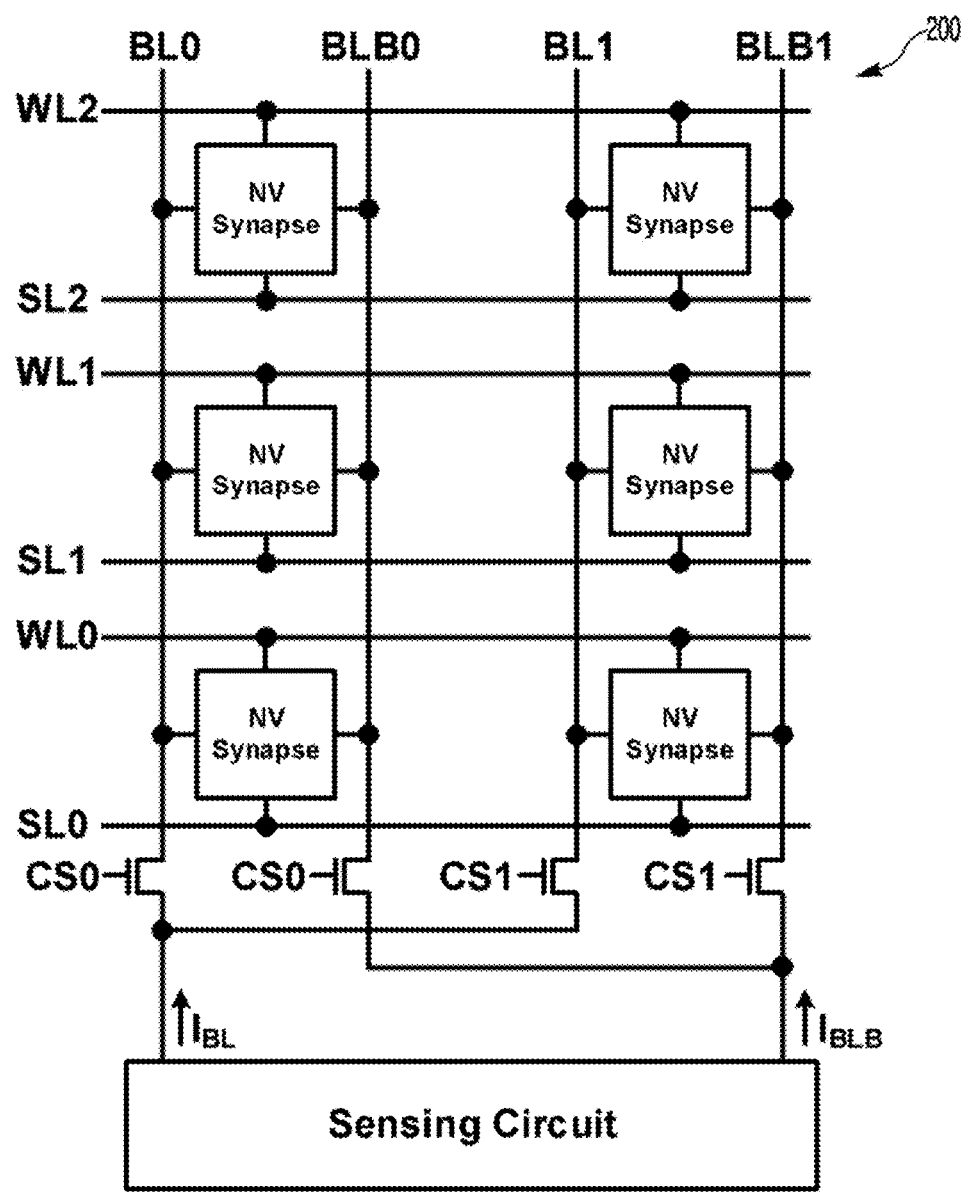
FIG. 2 is a simplified functional block diagram of an electronic synapse circuit array.
Figure 3:
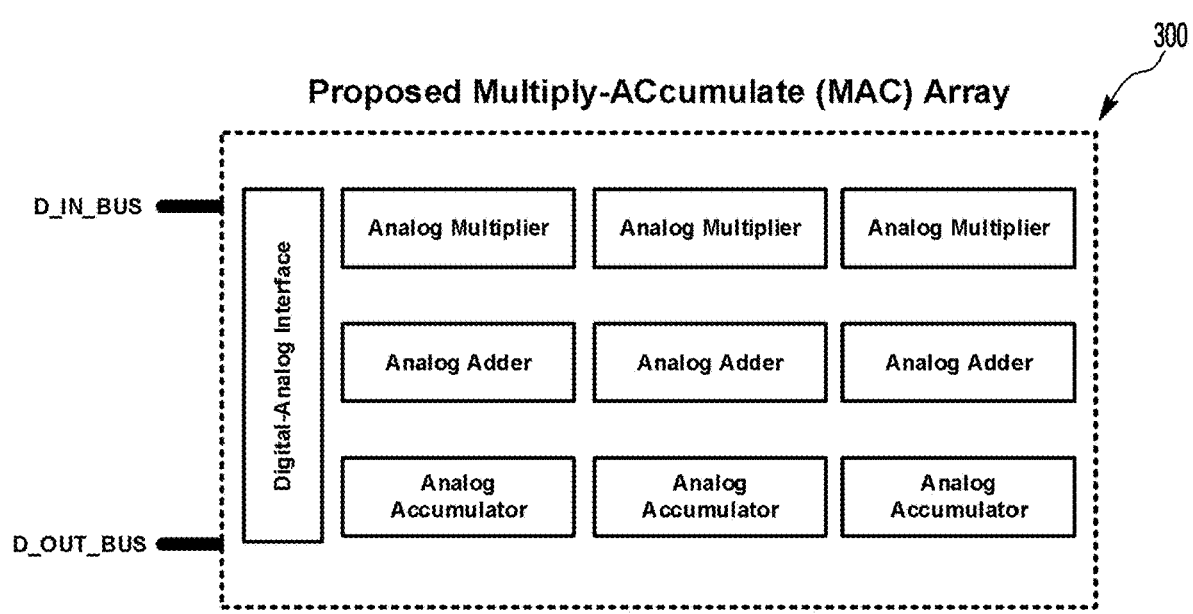
FIG. 3 is a simplified functional block diagram of one embodiment of the present invention.

FIG. 3 shows a simplified functional block diagram of one embodiment of the present invention. The MAC array 300 is configured with an input/output (I/O) bus to input or output a digital value to or from a digital interface. In this array, an analog multiplier, analog adder, and analog accumulator are configured to process data from a data input bus D_IN_BUS and output the processed values to the data output bus D_OUT_BUS. Namely, Digital/Analog Interference receives digital data and converts the received digital data into analog signals. The unit cells (i.e., analog multiplier, analog adder, and analog accumulator) in the MAC array 300 process the analog signals. The analog multiplier provides a product of the one converted analog input as a first operand X and the second digital or converted analog input as a second operand Y. The second operand Y can represent a filter coefficient or weight parameters in conjunction with a particular analog multiplier. The analog multipliers generate a plurality of partial products from the operands X and Y. The corresponding analog adder then sums up those partial products.

At the end of the analog adders, the analog accumulators accumulate the summated partial products to produce the analog outputs. Then, the digital-analog interface converts the accumulated analog outputs into digital outputs. These converted digital outputs are then taken out or fed back as one of the inputs to the next layer of the artificial neural network system via D_OUT_BUS. For a single MAC operation, each digit of one operand (from D_IN_BUS) is multiplied by each digit of the other operand (also from D_IN_BUS) to form partial products, the analog adder adds these results, then accumulated by the analog accumulator and carried out via D_OUT_BUS after converted into digital. Those analog circuits do not necessarily require full VDD-GND swing for key computation. They can carry multibit information in the single wire for approximately computable applications such as vision, language processing, and analog front-end backed by channel coding to fix the data path errors.

Figure 4:
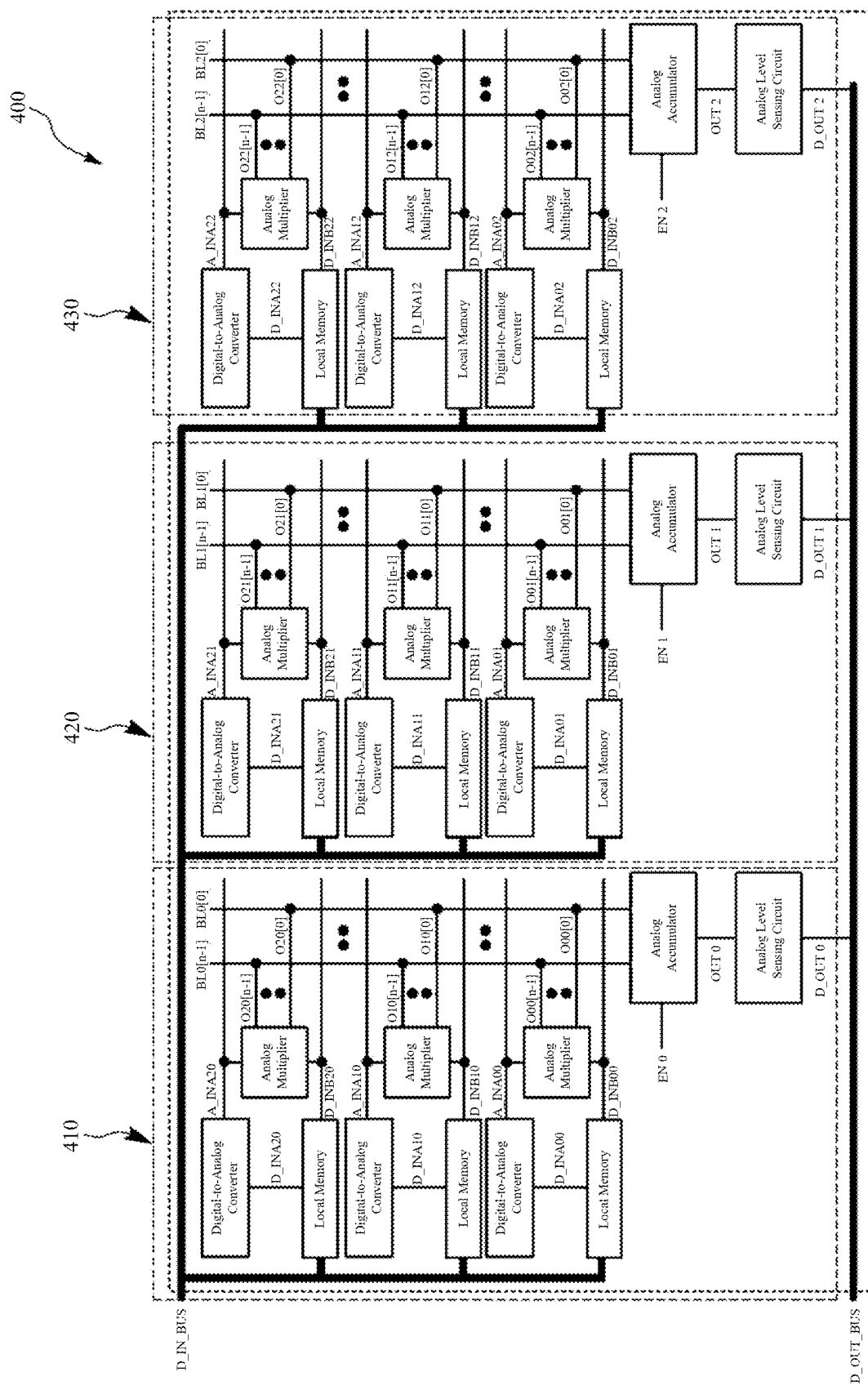
FIG. 4 is a functional block diagram of one embodiment of the present invention.

FIG. 4 shows a functional block diagram of one embodiment of the present invention. The present invention is not, however, limited to this particular configuration. Here, the multiply-accumulate array 400 includes a plurality of MAC circuit sets 410, 420 and 430 organized in a single column, each including a plurality of MAC cells organized in a matrix of rows and columns. Each circuit set 410, 420 and 430 include Analog Accumulator and Analog Level Sensing Circuit that are connected together. Although three rows and three columns for organizing the MAC cells in a MAC array 400 are shown, it should be understood that various combinations of rows and columns of MAC cells can be formed and maybe only limited by a particular chip architecture.

The three MAC circuit sets 410, 420 and 430 are connected together by D_IN_BUS and D_OUT_BUS such that each MAC circuit sets 410, 420 and 430 are provided with the common digital input from D_IN_BUS and add each partial digital product in D_OUT_BUS. Three MAC cells in each MAC circuit set 410, 420 and 430 are arranged in three rows and one column and can be connected together by one or more than one-bit lines (BL[0], BL[1], BL[2], etc.) that are electrically connected to one Analog Accumulator. Each of the MAC cells includes (1) a local memory, (2) a digital-to-analog converter, and (3) an analog multiplier. The local memory is configured to store the digital values of the local multiplier input vectors D_INA and D_INB. The local memory can be SRAM, ROM, OTP, Single-Poly Based EFLASH, MRAM, etc. During a system boot sequence, the default value of D_INB can be programmed in the local memory so that the instantaneous execution is possible as soon as D_INA is available.

Digital-to-Analog Converter produces analog voltage levels corresponding to its digital value. For example, it converts the digital value D_INA to the analog value A_INA.

Each analog multiplier in the MAC cell receives two voltage inputs A_INA in an analog domain (level: from GND to VDD) and D_INB in a digital domain (level: GND or VDD) and produces outputs in BL[n−1]BL[0] corresponding to the multiplication result of inputs in analog domain (i.e., current or charge). The resulting partial products are then summed up by the corresponding bit line, which serves as an analog adder.

As shown in FIG. 4, in a two-dimensional MAC cell 400, the first-bit line of the first column BL0[0] is electrically connected to a plurality of analog multipliers in three rows and the first line of the first column. The second bit line of the first column BL0[1] can electrically be connected to a plurality of analog multipliers in three rows and the second line of the first column. Likewise, the (n−1)$^{th}$ bit line of the first column BL0[n−1] can electrically be connected to a plurality of analog multipliers in three rows and the N-th line of the first column. The set of those bit lines in each MAC set are connected to a corresponding Analog Accumulator coupled to Analog Sensing Circuit at the edge of the array such that the accumulated analog output is converted to the corresponding binary bits, which is then outputted by D_OUT_BUS.

Each of the analog outputs (O00, O10, O20, etc.) denotes a partial product from the corresponding multipliers. O00[0] denotes a partial product from the analog multipliers in a first row and a first column for reaching at BL0[0] in the first MAC set. Likewise, O20[n−1] denotes a partial product from the analog multipliers in a third row and a first column for reaching at BL0[n−1] in the first MAC set. Multiple outputs (O2X~O0X) from analog multipliers can be accumulated on BLX[n−1]~BLX[0]. For instance, the partial outputs O00[0], O10[0], and O20[0] are summed up in the first bit line BL0[0] of the first MAC set. The partial product O00[n−1], O10[n−1], and O20[n−1] are summed up in the n-th bit line BL0[n−1] of the first MAC set.

The analog accumulators conduct the accumulation operation to the output wires (OUT0~OUT2) when they are enabled by EN signal. And then, the results are fed to the analog level sensing circuits to produce the digital output D_OUT0~D_OUT2, which are connected to the data out bus (D_OUT_BUS). By providing new vectors into A_INA and D_INB on-the-fly, any combinations of the two vectors can be computed instantaneously without reprogramming the analog multiplier. As an example, according to the proposed MAC array, when A_INA20, D_INB20, A_INA10, D_INB10, A_INA00, D_INB00 have corresponding values of 7, 3, 2, 9, 4, 3 to the input vectors, then the multiplier output vectors O20[n−1:0], O10[n−1:0], O00[n−1:0] have resulting values of 21=7×3, 18=2×9, 12=4×3, making the accumulated OUT0 of O20+O10+O00=21+18+12=51. Upon receiving this accumulated value, Analog Level Sensing Circuit converts it to the corresponding binary bits, which is then carried by D_OUT_BUS.

Figure 5:
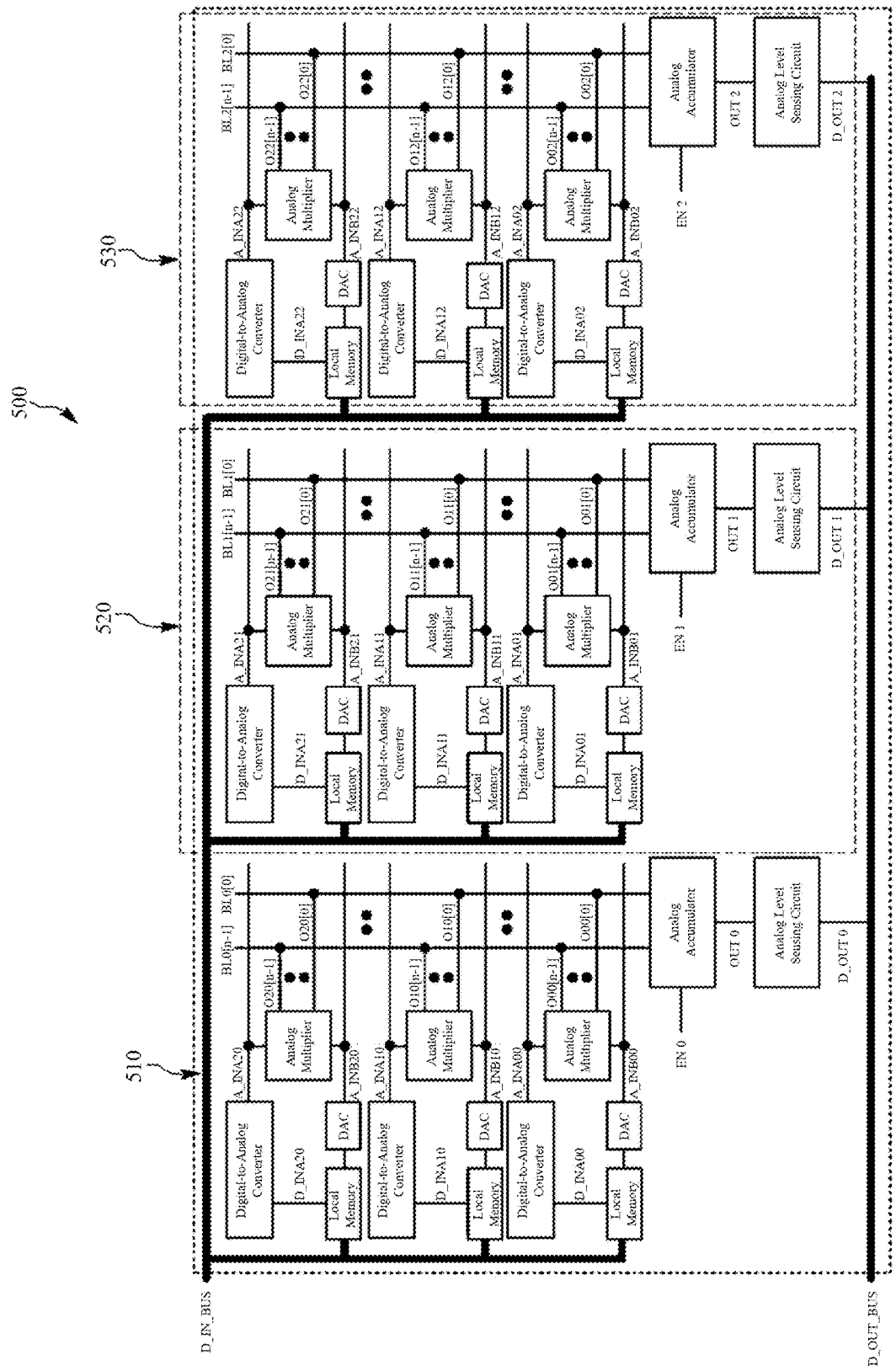
FIG. 5 is a functional block diagram of another multiply-accumulate array (MAC array) derived from the MAC array shown in FIG. 4.

FIG. 5 depicts a functional block diagram of another multiply-accumulate array (MAC array) derived from the MAC array in FIG. 4. Namely, each MAC cell of the MAC circuit sets 510, 520 and 530 in the MAC circuit array 500 is further configured with analog converter DAC for connecting the local memory and the analog multiplier. Thus, the analog multipliers can receive one pair of analog input signals A_INA from a first DAC and A_INB from a second DAC and produce the products in the corresponding bit line BL, the multiplication of inputs in two analog domains.

Figure 6:
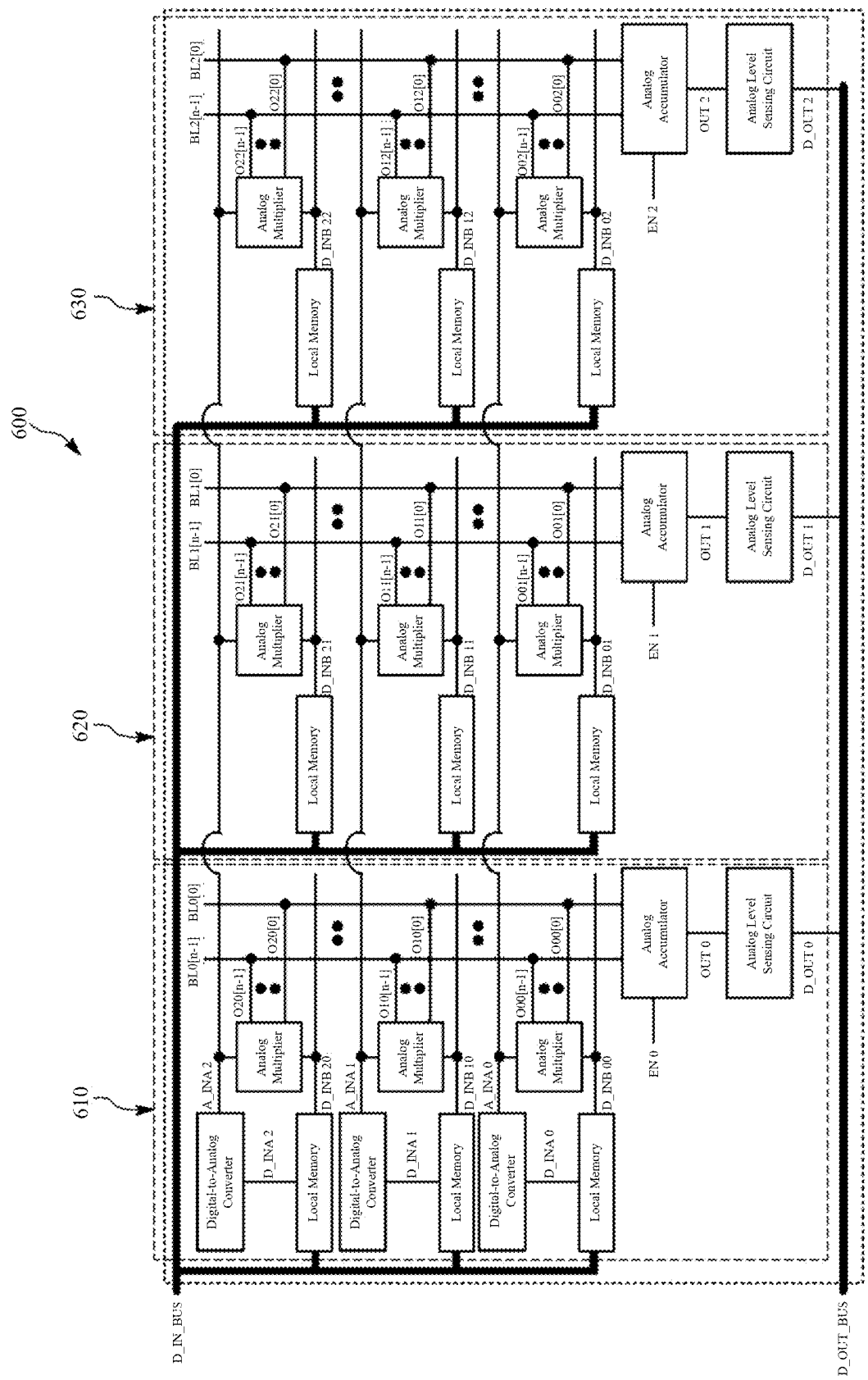
FIGS. 6 and 7 are functional block diagrams of another multiply-accumulate array (MAC array) derived from the MAC array shown in FIGS. 4 and 5, respectively.

FIG. 6 depicts functional block diagrams of another multiply-accumulate array (MAC array) derived from the MAC array shown in FIG. 4. The multiply-accumulate array 600 shows that separate analog input sources (Digital-to-Analog Converts) in MAC cell 420 and 430 are replaced with one common analog input source. Namely, a plurality of analog multipliers in the first row cells 620 and 630 receives the analog voltage input A_INA from a Digital-to-Analog Converter in cell 610. A plurality of analog multipliers in the second row receives the analog voltage input A_INA from a Digital-to-Analog Converter in the same row in MAC cell 610. A plurality analog multiplier in the third row receives the analog voltage input A_INA from a Digital-to-Analog Converter in the same row in MAC cell 610. As a result, the MAC Array can be configured with a reduced number of DAC so that the overall DAC space can be reduced.

Figure 7:
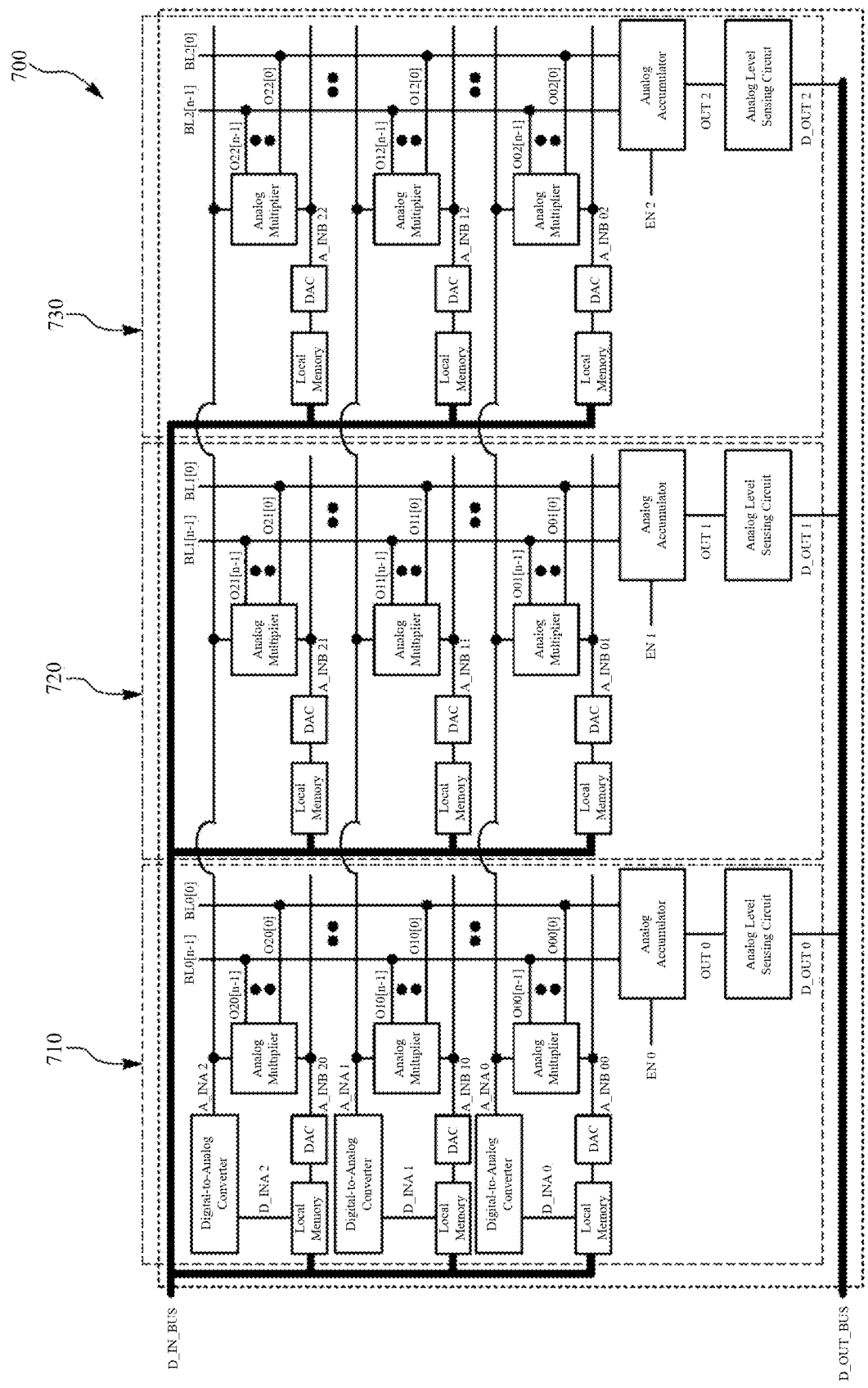

FIG. 7 depicts functional block diagrams of another multiply-accumulate array (MAC array) derived from the MAC array shown in FIG. 5. The multiply-accumulate array 700 shows that separate analog input sources (Digital-to-Analog Converts) in MAC cells 520 and 530 are replaced with one common analog input source. Namely, a plurality of analog multipliers in the first row cells 720 and 730 receives the analog voltage input A_INA from a Digital-to-Analog Converter in cell 710. A plurality of analog multipliers in the second row receives the analog voltage input A_INA from a Digital-to-Analog Converter in the same row in MAC cell 710. A plurality analog multiplier in the third row receives the analog voltage input A_INA from a Digital-to-Analog Converter in the same row in MAC cell 710. As a result, the MAC Array can be configured with a reduced number of DAC so that the overall DAC space can be reduced.

Figure 8:
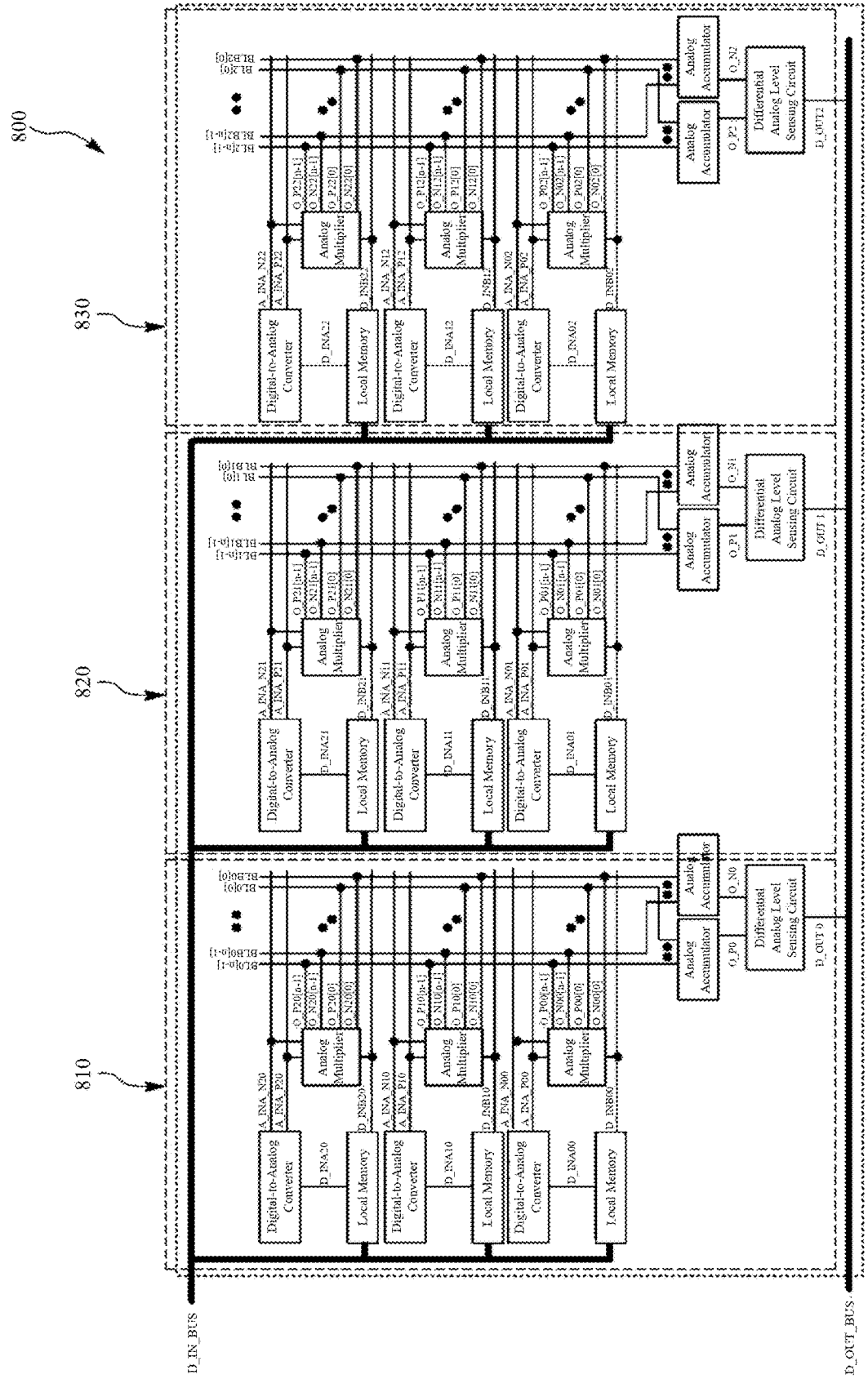
FIG. 8 is a functional block diagram of another multiply-accumulate array (MAC array) derived from the MAC array shown in FIG. 4.

FIG. 8 depicts a functional block diagram of another multiply-accumulate array (MAC array) derived from the MAC array in FIG. 4. The multiply-accumulate array 800 includes a plurality of MAC circuit sets 810, 820 and 830 arranged in a single column, each including a plurality of MAC cells organized in a matrix of rows and columns. In the multiply-accumulate array 800 each of the Digital-to-Analog Converts is configured to generate a pair of differential analog input voltages (A_INA_N and A_INA_P). Each of the Analog Multipliers connected to the Digital-to-Analog Converters is configured to produce differential output pairs (O_P[n−1] and O_N[n−1])~(O_P[0] and O_N[0]) in the analog domain (i.e., current or charge) based on a differential input voltage pair in an analog domain (A_INA_P and A_INA_N) in response to the voltage input in a digital domain (D_INB).

Multiple outputs from analog multipliers can be accumulated on BL[n−1]~BL[0] and BLB[n−1]~[BLB[0], respectively. The accumulated differential output pairs (O_P0, O_N0), (O_P1, O_N1), and (O_P2, O_N2) are inputted to the corresponding Differential Analog Level Sensing Units, respectively, when they are enabled. Consequently, the results are fed to the analog level sensing circuits to produce the signal output D_OUT0~D_OUT2s. By providing new vectors into A_INA_N, A_INA_P, and D_INB, any combinations of the two vectors can be computed on-the-fly without limiting the available neural network model within the given analog multiplier capacity. As an example according to the proposed MAC array, when A_INA_P20, A_INA N20, D_INB20, A_INA P10, A_INA N10, D_INB10, A_INA_P00, A_INA_N00, D_INB00 have corresponding values to 5, 3, 3, 3, 5, 2, 6, 2, 1, then the current difference vectors (i.e. O_P20-O_N20, O_P10-O_N10, O_P00-O_N00) have resulting values of 6=(5−3)×3, 4=(3−5)×2, 4=(6−2)×1, making the accumulated current difference O_P0-O_N0 (=D_OUT0) of (O_P20-O_N20)+(O_P10-O_N10)+(O_P00-O_N00)=6+(−4)+4=6.

Figure 9:
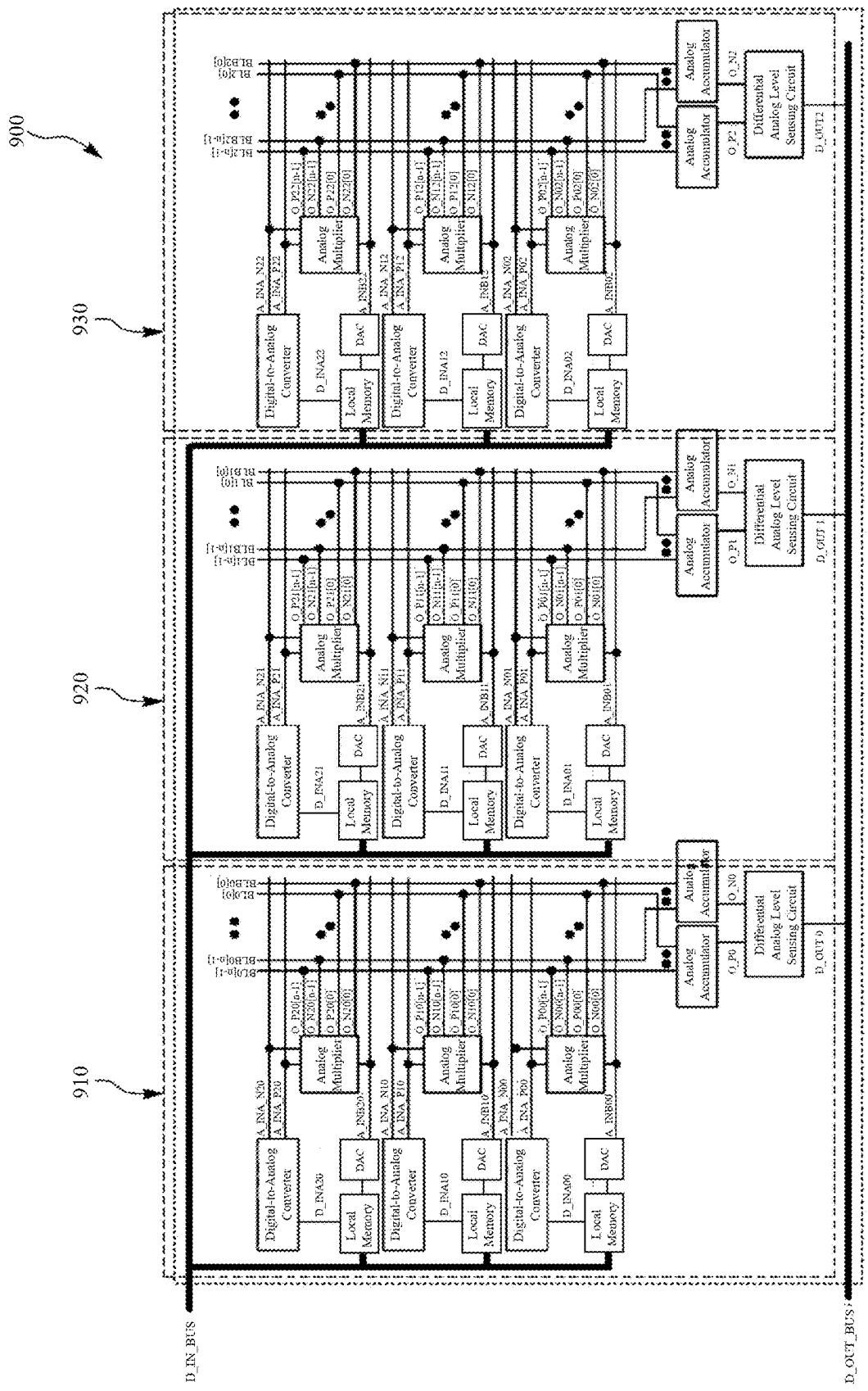
FIG. 9 is a functional block diagram of another multiply-accumulate array (MAC array) derived from the MAC array in FIG. 8.

FIG. 9 shows a functional block diagram of another multiply-accumulate array (MAC array) derived from the MAC array in FIG. 8. In FIG. 9, the multiply-accumulate array 900 includes a plurality of MAC circuit sets 910, 920 and 930. The analog multiplier receives two analog input values A_INA and A_INB from the local digital-to-analog converter (DAC) connected to the local memory. Multiple outputs from analog multipliers can be added on BL[n−1]~BL[0] and BLB[n−1]~[BLB[0], respectively, and then the analog accumulators conduct the accumulation operation to the output wires (O_P0~2 and O_N0~2) differentially when they are enabled. Consequently, the results are fed to the analog level sensing circuits to produce the signal output D_OUT0~D_OUT2.

Figure 10:
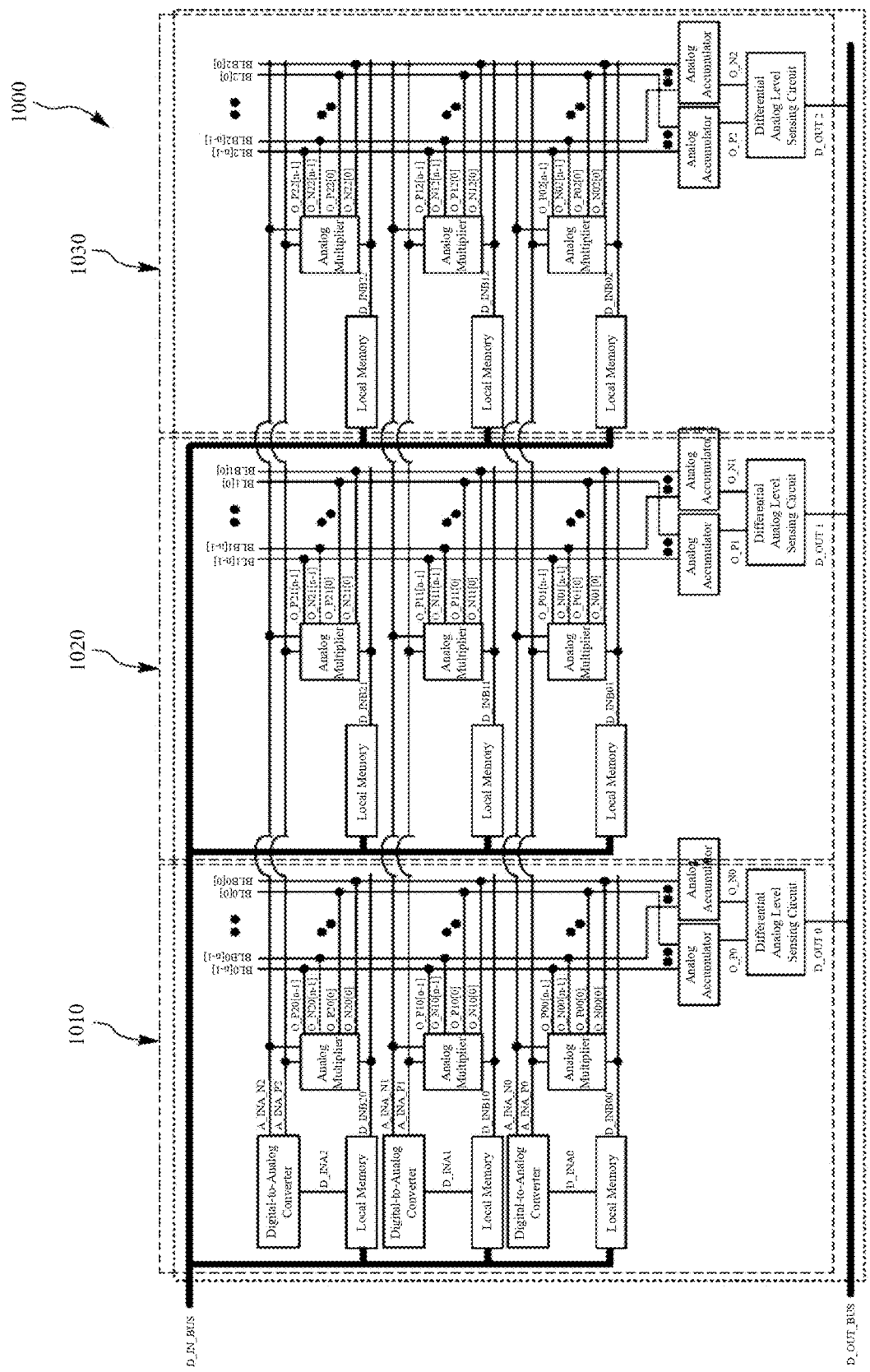
FIGS. 10-11 show other proposed MAC arrays derived from FIGS. 8-9, respectively.
Figure 11:
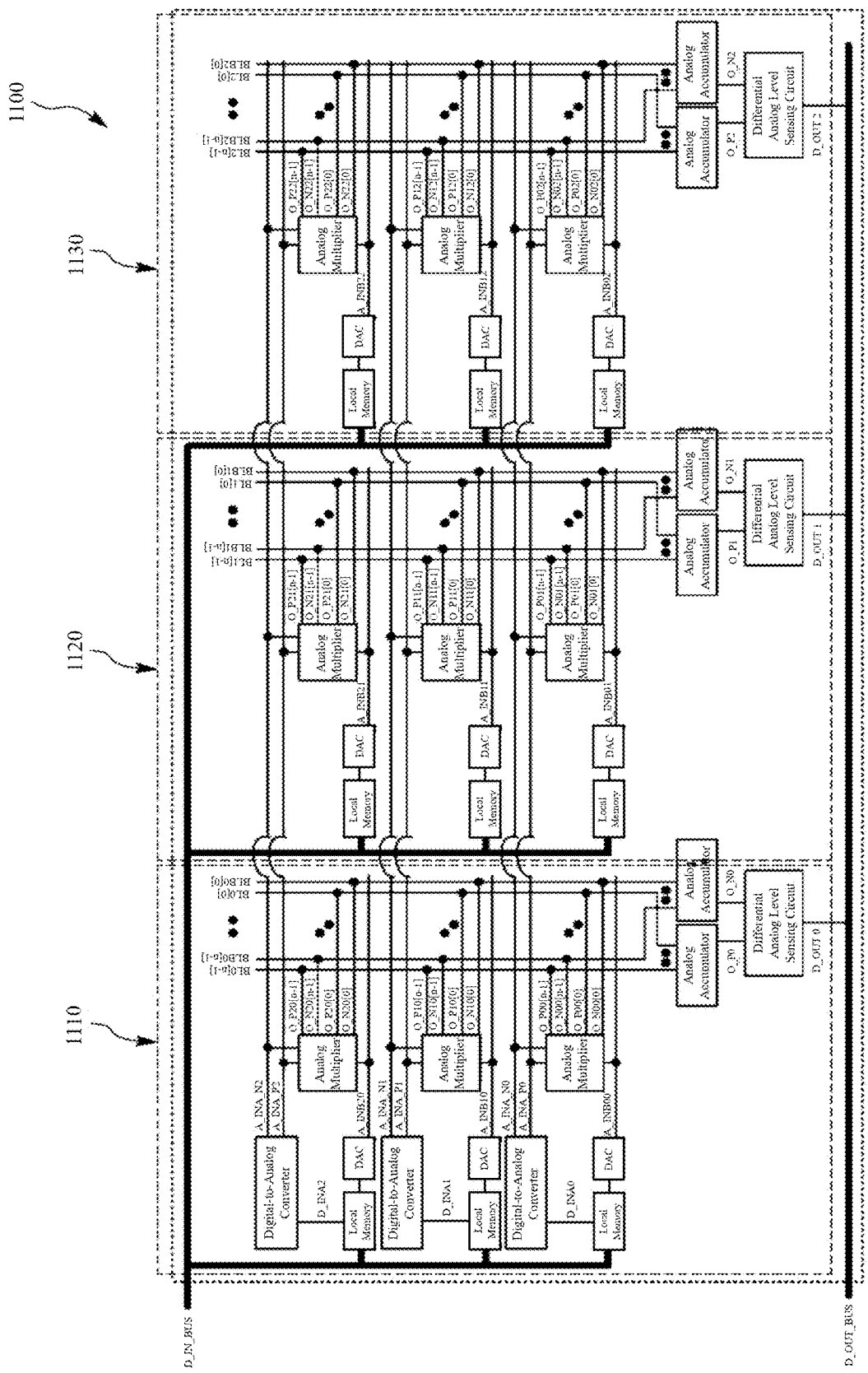

FIGS. 10-11 show other proposed MAC arrays, 1000 and 1100, derived from FIGS. 8-9, respectively. In FIG. 10, the multiply-accumulate arrays 1000 include a plurality of MAC circuit sets 1010, 1020, 1030. In FIG. 11, the multiply-accumulate arrays 1100 includes a plurality of MAC circuit sets 1110, 1120, 1130. In FIGS. 10-11, the three analog multipliers in the same row receive the common differential analog voltage inputs A_INA and A_INP. More precisely, the analog multipliers in the first row receive the common analog operand A_INA_N0 and A_INA_P0. The analog multipliers in the second row receive the common analog operand A_INA_N1 and A_INA_P1. The analog multipliers in the third row receive the common analog operand A_INA_N2 and A_INA_P2. Here, the multiple separate Digital-to-Analog Convertors (analog input sources) in FIGS. 8-9 are replaced with the single common analog input source in each row. As a result, the MAC Array can be configured with a reduced number of DAC so that the overall DAC space can be reduced. The same analog voltage levels A_INA_N0~2, A_INA_P0~2 can be shared and driven through the multiple columns. Since the same digital-to-analog converter output is shared, the overall DAC area of the required local memory size is reduced. In FIG. 11, three analog multipliers in the same row receive the common differential analog voltage inputs A_INA_NX and A_INA_PX.

Figure 12:
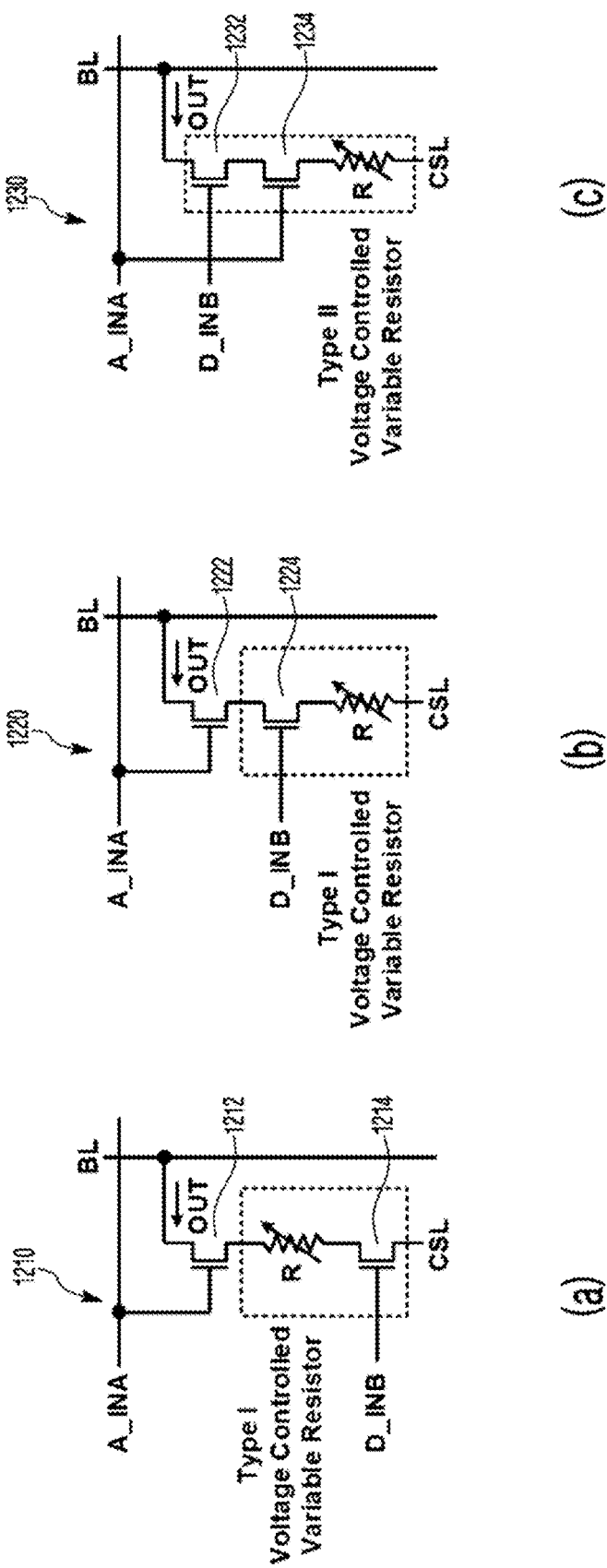
FIG. 12 shows exemplary analog multiplier circuits according to the present invention.

FIG. 12 shows exemplary analog multiplier circuits according to the present invention. The analog multiple circuit is configured to produce a digital output signal by processing an analog input signal in combination with a digital input signal received. Specifically, this circuit is configured to produce an output current (OUT) to a bit line (BL) node in response to receiving an input analog voltage A_INA and a 1-bit digital input voltage signal D_INB. Each analog multiplier circuit includes (1) an access transistor for receiving an input analog voltage A_INA from a supply node and (2) a variable resistor R for storing data based on its conductance state, and (3) a switching transistor having a gate terminal for receiving the digital input voltage signal D_INB to control the output current level.

The variable resistor R is also nonvolatile, so it does not require continuous power to retain the stored data. As one embodiment, the variable resistor R is configured to be programmed to have a specific value before operating the analog multiplier circuit because R cannot be set or modified its value during the active operation of the circuit. There are further details of the variable resistor R, as described in FIGS. 13 and 14.

The switching transistor is configured to be active in response to the digital input voltage signal (D_INB) for switching on or off the multiplication result of the input voltage A_INA and the variable resistor R's programmed conductance value. During the circuit running, the magnitude of the digital input voltage signal (D_INB) dynamically changes ("on the fly" selection) the status of the switching transistor. More precisely, when a digital input voltage signal D_INB is high to turn on the switching transistor, the amount of the output current flow (OUT) in the BL node can be proportional to a multiplication result of the analog voltage input A_INA and the inverse of a preset resistance R or its conductance value. On the other hand, when the digital input voltage signal (D_INB) becomes low to turn off the switching transistor, the output current (OUT) can be reduced to a trivial level. That is, when the low value of the signal D_INB is reduced to a trivial level, the switching transistor is then kept in the non-conducting condition with certainty.

In FIG. 12(a), analog multiplier circuit 1210 is configured with a voltage-controlled variable resistor including a variable resistor R and a switching transistor 1214 for controlling an output current on a bit line BL based on the digital input voltage signal D_INB applied to its gated terminal. A source region of an access transistor 1212 connected to an input voltage A_INA is coupled to one end of the variable resistor R, and the other end of the variable resistor R is coupled to a drain region of the switching transistor 1214. In FIG. 12 (b), the configured analog multiplier circuit 1220 shows that a variable resistor R and the switching transistor 1224 are arranged such that a source region of an access transistor 1222 is coupled to a drain region of the switching transistor 1224, and a source region of the switching transistor 1224 is connected to one end of the variable resistor R. In FIG. 12(c), the configured analog multiplier circuit 1230 shows that analog multiplier circuit 1230 is configured with a voltage-controlled variable resistor includes (1) one switching transistor 1232 for controlling the current flow in a bit line BL in response to the digital input voltage signal (D_INB) applied to a gate region of the switching transistor 1232, (2) one access transistor 1234 operable in responses to input analog voltage A_INA, and (3) the variable resistor R. The variable resistor R is configured to store the state by its resistance.

Figure 13:
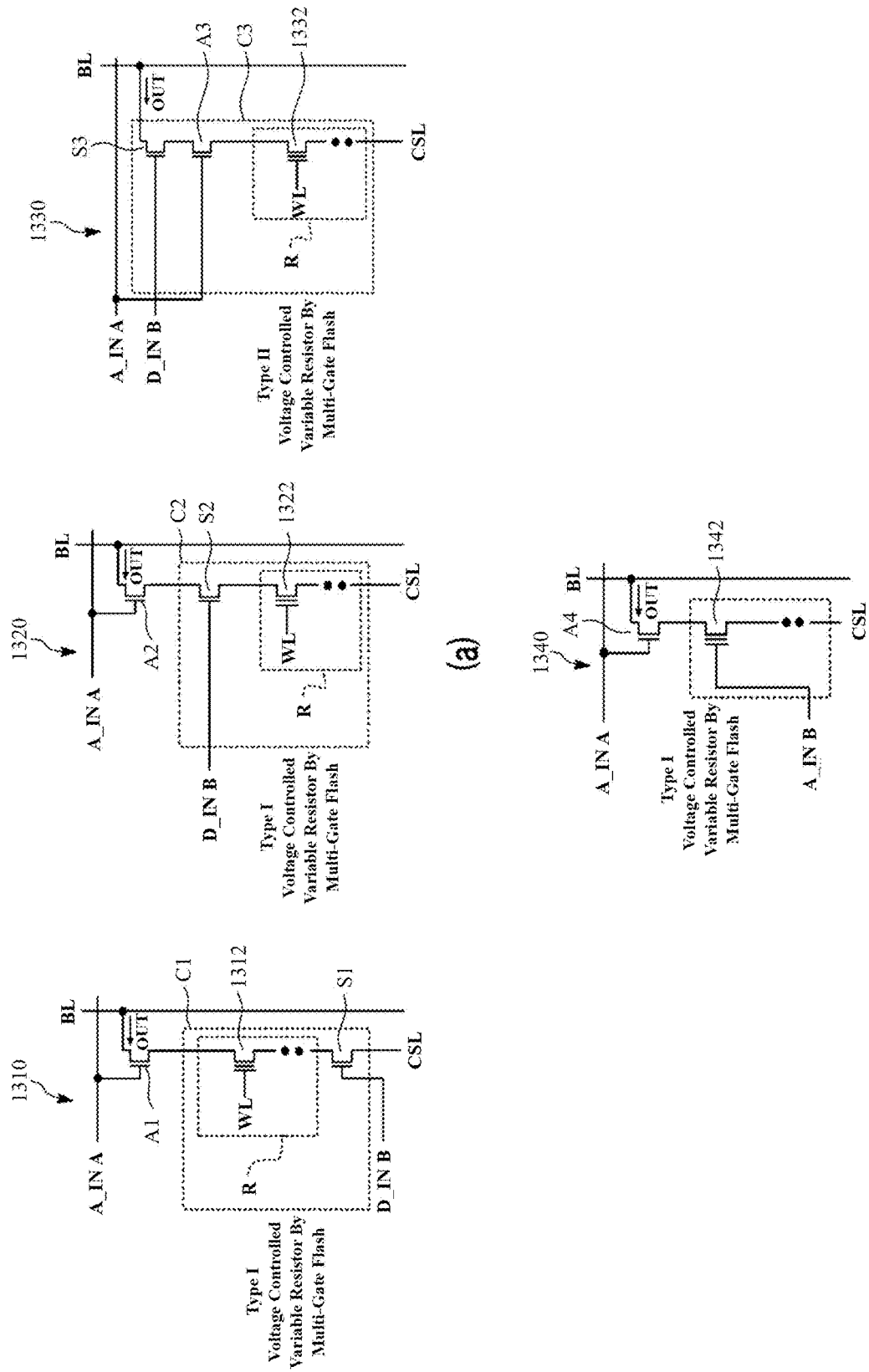
FIG. 13 depicts exemplary voltage controlled variable resistors for multiplier circuits that are involved in FIG. 12.

FIG. 13 depicts exemplary memory resistors of the analog multiplier circuit according to one embodiment. As shown in FIG. 13, the voltage-controlled variable resistor in FIG. 12 can be configured by a set of flash memory cells. Those flash memory cells are arranged in a row for storing the state by its cell threshold voltage. Each cell can be a floating-gate memory transistor with a control gate coupled to one of a plurality of word lines (WL1, WL2, WL3, etc.).

FIG. 13(a) shows a portion of the variable resistor R described in FIG. 12. As one embodiment of Type I voltage controlled variable resistor, an analog multiplier circuit 1310 includes a voltage controlled variable resistor, in which a source terminal of a flash memory cell (not specified) in a variable resistor R is connected to a drain terminal of a switching transistor S1. Furthermore, a drain terminal of a first flash memory cell 1312 is connected to a source terminal of an accessing transistor A1 and a source terminal of the first flash memory cell 1312 can be connected to a drain terminal of another flash memory cells (not specified). The number of flash memory cells, including 1312, is not specified, but it should be understood that one or a plurality of the flash memory cells (floating-gate transistor) can be arranged in series in this way.

As another embodiment of Type I voltage-controlled variable resistor, an analog multiplier circuit 1420 shows a voltage-controlled variable resistor, in which a source terminal of a switching transistor 1428 is connected to a drain terminal of a read transistor 1424. Furthermore, a source terminal of an access transistor 1422 is connected to a drain terminal of a switching transistor 1428, and a source terminal of the last read transistor (not specified) is connected to a common source line CSL through a wire or another serially connected transistors (not shown). A voltage-controlled variable resistor R includes a read transistor 1424 configured to form a floating gate FG with a pair of coupling transistors 1426 and 1427.

As one embodiment of Type II voltage-controlled variable resistor, an analog multiplier circuit 1430 has a voltage-controlled variable resistor including (1) one switching transistor 1438, (2) one access transistor 1432, and (3) at least one voltage controlled variable resistor. Namely, a source terminal of the switching transistor 1438 is connected to a drain terminal of the access transistor 1432, and a source terminal of the access transistor 1432 is connected to a drain terminal of the read transistor 1434. Also, the read transistor 1434 forms a floating gate FG with a pair of coupling transistors 1436 and 1437.

Given those circuit designs discussed above, when a digital input voltage signal D_INB is high to turn on the switching transistor, the amount of output current (OUT) in the BL node can be proportional to the multiplication result of the analog voltage input A_INA and the inverse of a preset resistance value R. On the other hand, when the digital input voltage signal D_INB is low to turn off the switching transistor, the amount of output current (OUT) can be reduced to a trivial level. That is, when the low value of the signal D_INB to be received by the switching transistor is reduced to a trivial level, the switching transistor is then kept in the non-conducting condition with certainty.

In FIG. 13(*b*), as another embodiment of Type I voltage controlled variable resistor, an analog multiplier circuit 1340 has a voltage controlled variable resistor consisting of one flash memory cell 1342. Namely, the flash memory cell 1342 has a gate terminal configured to receive an analog input voltage A_INB (i.e., analog voltage level between GND and VDD). In this case, an analog level A_INB can be driven from the DACs in FIGS. 5, 7, 9, and 11. The current flow in a bit line (BL) represents the multiplication result of (1) carefully selected analog input voltage levels (A_INA or A_INB) and (2) a programmed resistance value of the variable resistor R.

Figure 14:
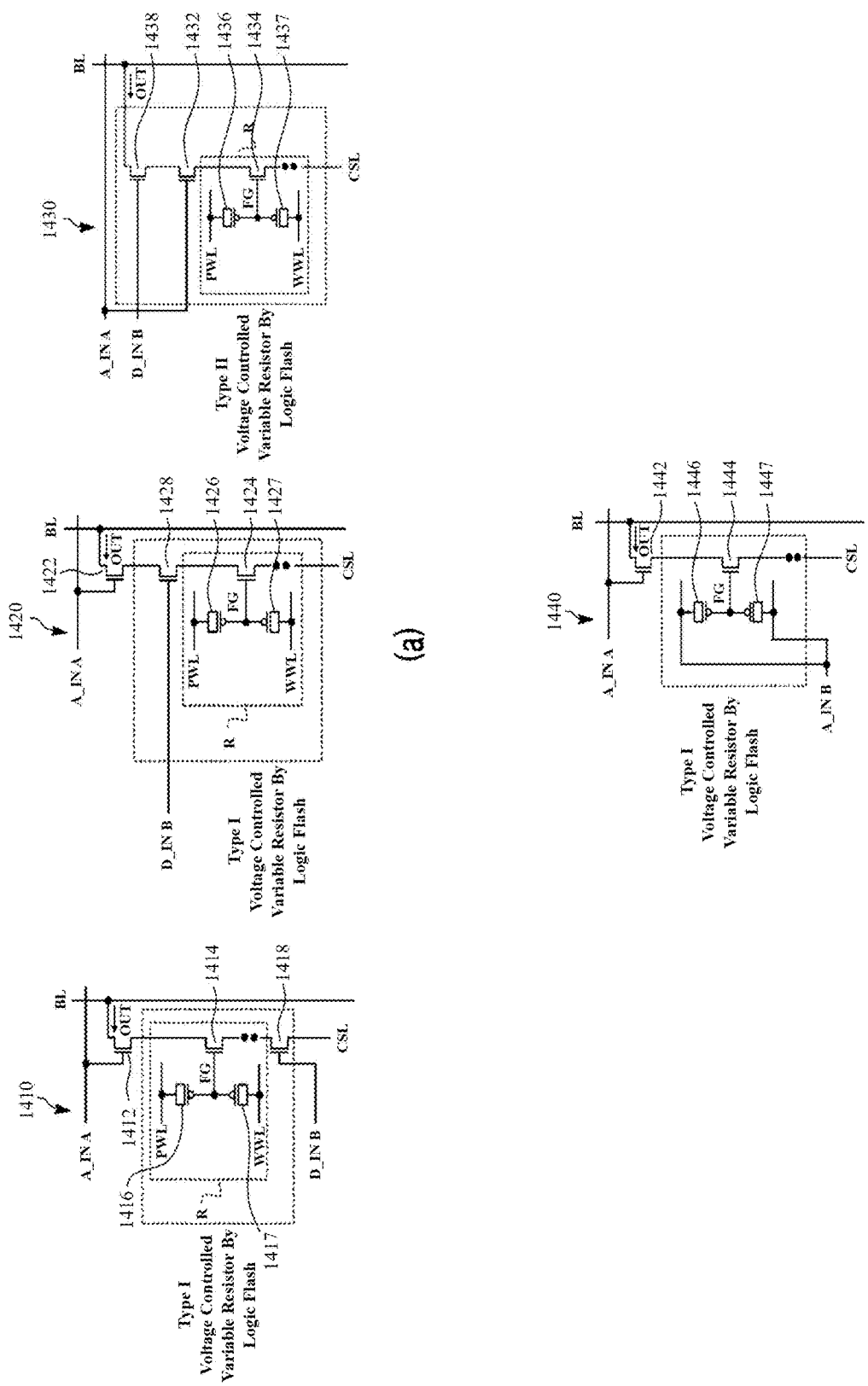
FIG. 14 depicts exemplary voltage controlled variable resistors for the analog multiplier circuits in FIG. 12.

FIG. 14 depicts exemplary memory resistors for the analog multiplier circuits in FIG. 12. Here, the variable resistor R includes one or more than one read (standard logic) transistors, each connected to a pair of coupling transistors through a floating gate (FG) node as a charge storage node. In FIG. 14(*a*), as one embodiment, an analog multiplier circuit 1410 shows a voltage-controlled variable resistor R including one read (standard logic) transistor 1414 configured to form a floating gate FG as a charge storage node with a pair of coupling transistors 1416 and 1417. Namely, a first transistor 1416 is connected to a program word line PWL for providing a program voltage to the floating gate. A second transistor 1417 is connected to a write word line WWL for data write operation. Although only one read transistor 1414 is described, it should be understood that more than one read transistor can be arranged in series to form the variable resistor R. When more than one read transistor forms the variable resistor R, a first read transistor keeps a first pair of word lines (PWL and WWL) that are separate from a second pair of the word lines (not shown) connected to a second read transistor (not shown).

The floating gate (FG) node voltage can be programmed to the targeted specific value. Thus, when D_INB is high for turning "on" the selection transistor, the current flow (OUT) in a bit line (BL) can be proportional to the multiplication of a preset A_INA and conductance of the variable resistance R that is equivalent to an inverse of the resistance value of the variable resistor R. On the other hand, the current flow (OUT) can be reduced to a trivial level when D_INB is low for turning off the selection transistor. Although a specific number of the read transistors or the selection transistors are shown, it should be understood that any number of the read transistors and/or the selection transistors can be serially connected.

The read transistor 1414 has (1) a drain terminal connected to a source of an access transistor 1412 for receiving an analog input voltage A_INA and (2) a source terminal connected to a drain of the switching transistor 1418 through a wire or multiple read transistors (not shown) for receiving a digital input voltage (binary digital inputs 0 and 1) D_INB. The switching transistor 1418 is configured to enable or disable a flow of current in the bit line in response to the digital input voltage (D_INB) applied to a gate region of the switching transistor 1418.

As another embodiment of Type I voltage-controlled variable resistor, an analog multiplier circuit 1420 shows a voltage-controlled variable resistor, in which a source terminal of a switching transistor 1424 is connected to a drain terminal of a read transistor 1426. Furthermore, a source terminal of an access transistor 1422 is connected to a drain terminal of a switching transistor 1424, and a source terminal of the last read transistor (not specified) is connected to a common source line CSL through a wire or another serially connected transistors (not shown).

As one embodiment of Type II voltage-controlled variable resistor, an analog multiplier circuit 1430 has a voltage-controlled variable resistor including (1) one switching transistor 1432, (2) one access transistor 1434, and (3) at least one voltage controlled variable resistor. Namely, a source terminal of the switching transistor 1432 is connected to a drain terminal of the access transistor 1434, and a source terminal of the access transistor 1434 is connected to a drain terminal of the read transistor 1436.

Given those circuit designs discussed above, when a digital input voltage signal D_INB is high to turn on the switching transistor, the amount of output current (OUT) in the BL node can be proportional to the multiplication result of the analog voltage input A_INA and the inverse of a preset resistance value R. On the other hand, when the digital input voltage signal D_INB is low to turn off the switching transistor, the amount of output current (OUT) can be reduced to a trivial level. That is, when the low value of the signal D_INB to be received by the switching transistor is reduced to a trivial level, the switching transistor is then kept in the non-conducting condition with certainty.

In FIG. 14(*b*), as another embodiment of Type I voltage-controlled variable resistor, an analog multiplier circuit 1440 has a voltage-controlled variable resistor consisting of one read (standard logic) transistor 1444 or more than one read transistor. And a source terminal of an access transistor 1442 is connected to a drain terminal of a read transistor 1444. Namely, the first 1446 and second 1447 transistors have a common body terminal for receiving an analog input voltage A_INB (i.e., analog voltage level between GND and VDD). Analog level A_INB can be driven from the DACs in FIGS. 5, 7, 9 and 11. The current flow in a bit line (BL) represents the multiplication result of (1) carefully selected analog input voltage levels (A_INA or A_INB) and (2) a programmed resistance value of the variable resistor R (a block in dashed lines).

Figure 15:
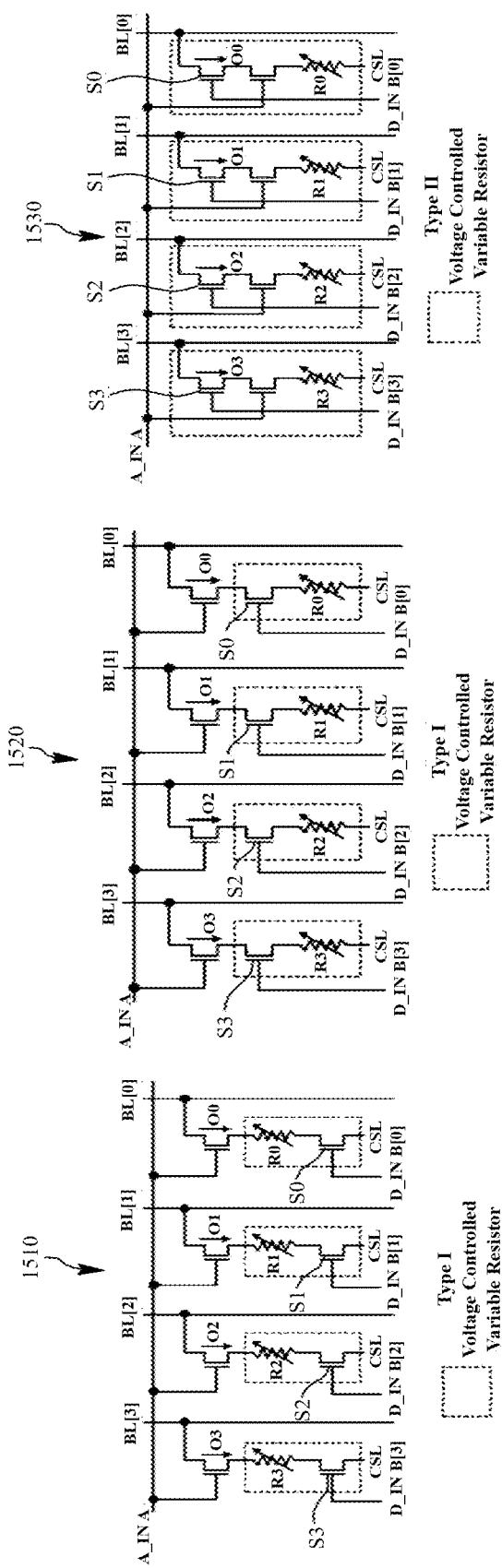
FIG. 15 shows a schematic representation of analog multiplier circuit arrays according to one embodiment.

FIG. 15 shows a schematic representation of analog multiplier circuit arrays according to one embodiment. FIG. 15 shows three exemplary arrays 1510, 1520 and 1530, in which a group of four analog multiplier circuits are contacted along with a single voltage source node. Each multiplier in the group is described in FIG. 12. The four analog multipliers in each array are configured to generate four output current flows (O3~O0) in four-bit lines (BL[3]~BL[0]) in response to a combination of an analog input voltage A_INA and each of the four digital input signal D_INB[3]~D_INB[0]. The four-bit lines BL[3], BL[2], BL[1], and BL[0] in the array are designed such that D_INB[3] is the most significant bit, and D_INB[0] is the least significant bit.

A plurality of switching transistors S3, S2, S1 and S0 in each array are configured to activate or deactivate the output current flows in four-bit lines (BL[3]~BL[0]) in response to receiving the four digital input voltages (D_INB[3]~D_INB[0]) that are applied to a gate region of the switching transistors S3, S2, S1, and S0, respectively. The variable resistors R3, R2, R1, and R0 can be programmed before running the circuit. Further, as a scaling factor K (i.e., K=1, 2, 3, etc., an integer number) specified, the programmed resistance value can have values to identify the origins (bit-lines) of the output current flow.

The output current flow in the bit line BL can be determined by the multiplication result between the carefully selected input voltage signal A_INA (operand X) and the inverse of the resistance value R (operand Y). Thus, the resistance (values) of the group of variable resistors (R3, R2, R1, and R0) can be deliberately set to identify the bit lines (digit locations) the output current flows in. In other words, the magnitude of currents O1, O2, and O3 can be scaled with reference to the magnitude of output current O0. When a scaling factor K is set to 2 with reference to the output current O0 having a magnitude value of 1, the magnitude of the output currents O0, O1, O2, and O3 will reach values of 1, 2, 4, and 8. Setting a scaling factor is to accurately distinguish one from other output currents on the bit lines. The output currents O3-O0 are proportional to the multiplication result between the carefully selected A_INA and the inverse of the resistance values R3~R0 when the corresponding D_INB bits are high. On the other hand, when "low" digital signals (D_INB) deactivate the switching transistors, respectively, the amounts of output currents O3-O0 through bit lines (BL) reduce to a trivial level.

The current flows O3, O2, O1 and O0 in a pair of bit lines BL3, BL2, BL1 and BL0 are determined by a specific combination of the analog input voltage A_INA, and a digital input voltages D_INB3, D_INB2, D_INB1 and D_INB0, respectively. Thus, the output (data) of the multiplication based on the analog voltage inputs and programmed static resistance of the resistor R can be continuously changed. Furthermore, by supplying new vectors into A_INA, and D_INB, any combinations of the two vectors can be computed on-the-fly without limiting the available combinations of the multiplication of the neural network model within the given variable resistor count in the array.

Figure 16:
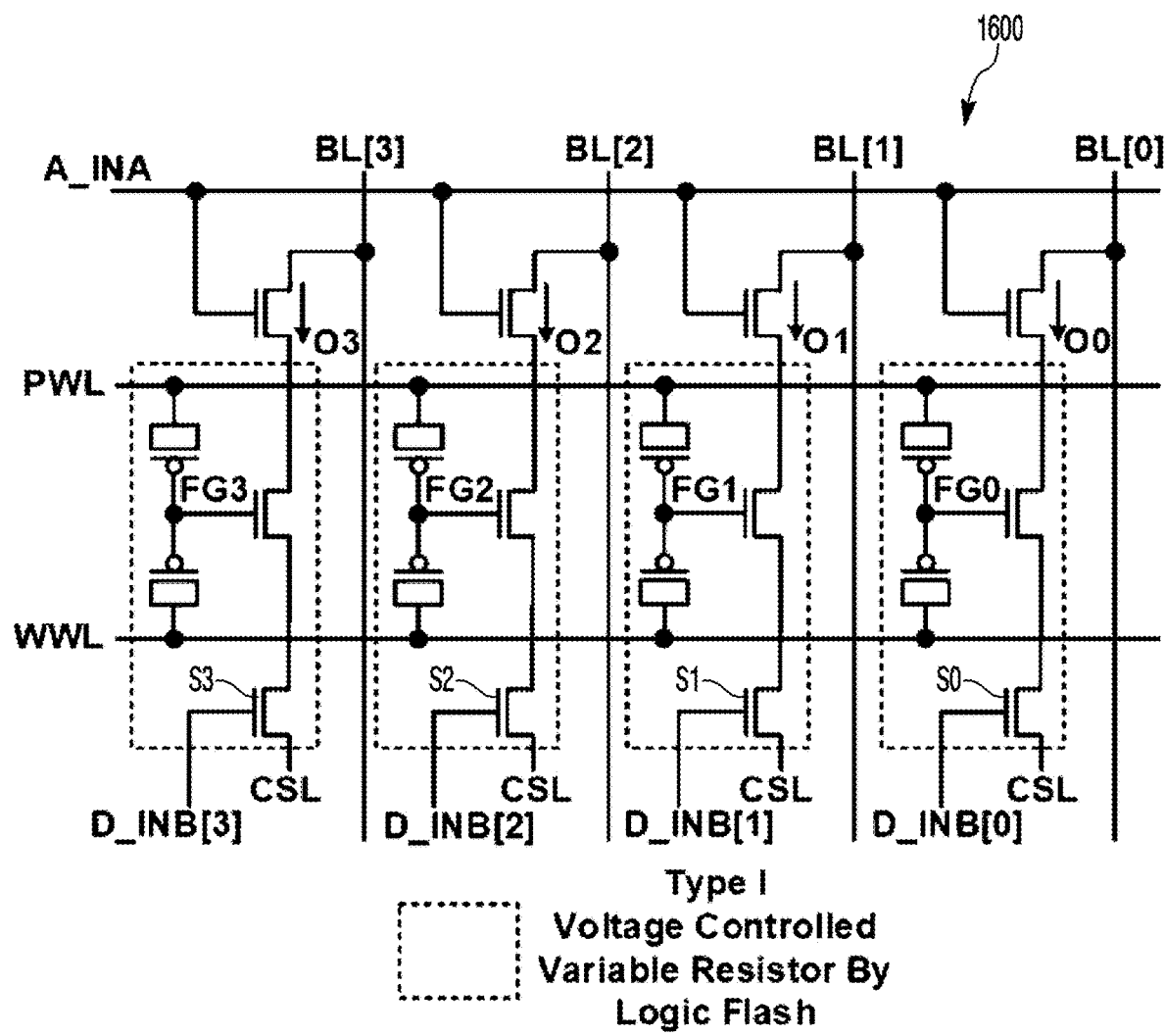
FIG. 16 shows a schematic representation of an analog multiplier circuit array according to one embodiment.

FIG. 16 shows a schematic representation of an analog multiplier circuit array according to one embodiment. In the analog multiplier circuit array 1600, a program word line PWL is electrically connected to a first of the pair of coupling transistors to apply a program voltage to a plurality of floating gates FG3, FG2, FG1 and FG0. A write word line WWL is electrically connected to a second of the coupling transistors for data write operation. The circuit receives an input analog voltage A_INA and the four digital input voltage signals D_INB[3], D_INB[2], D_INB[1] and D_INB[0], wherein D_INB[3] is the most significant bit and D_INB[0] is the least significant bit, produces the resulting output currents O3, O2, O1 and O0 flowing through the bitlines BL[3], BL[2], BL[1] and BL[0], respectively.

This is a multibit D_INB implementation of the FIG. 14. The node voltages FG3, FG2, FG1 and FG0 are programmed to specific values before the operation so that the amounts of O3~O0 have the relationship of O3=kxO2, O2=kxO1 and O1=kxO0 (i.e., k=1, 2, 3, etc., an integer number) and they are proportional to the multiplication result of the carefully selected A_INA and the inverse of the effective resistance values of the NMOS devices connected to the FG nodes when the corresponding D_INB bits are high. On the other hand, when a "low" each digital signal D_INB[3], D_INB[2], D_INB[1] and D_INB[0] deactivate the switching transistor S3, S2, S1 and S0, respectively, thus the amounts of output currents flowing in bit lines BL[3], BL[2], BL[1] and BL[0] reduce to a trivial level.

Figure 17:
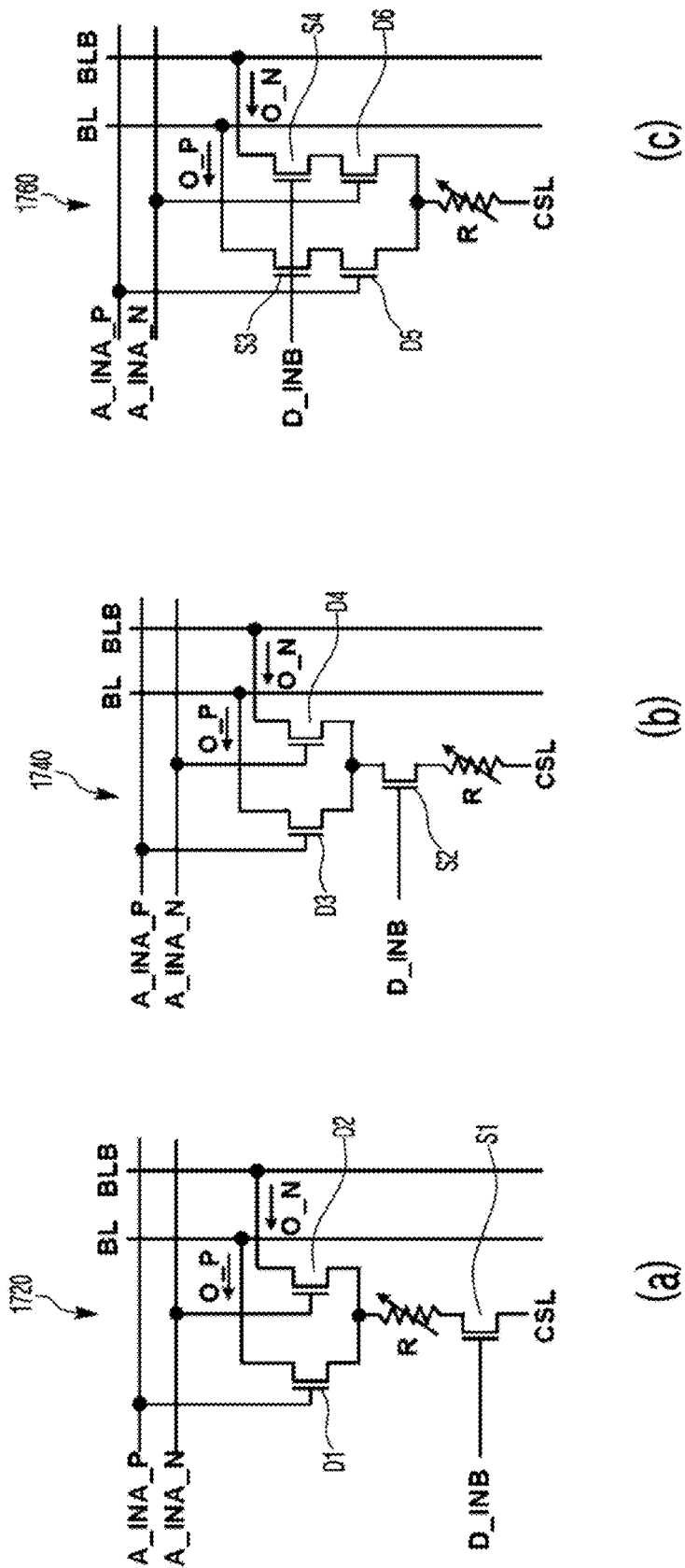
FIG. 17 shows some examples of a schematic circuit diagram of analog multiplier circuits with differential voltage-controlled variable resistors according to one embodiment of the present invention.

FIG. 17 shows some examples of a schematic circuit diagram of analog multiplier circuits with differential voltage-controlled variable resistors according to one embodiment. In FIG. 17, each analog multiplier circuit 1720, 1740 and 1760 include a differential pair of n-channel MOS transistors connected to a resistor R and one or more than one switching transistors. The analog multiplier is configured to receive a pair of analog input voltage signals (A_INA_P and A_INA_N) and digital input voltage signal D_INB and produce a pair of current flows (O_P and O_N) in a pair of bit lines (BL and BLB), respectively.

A first MOS transistor of the differential pair of n-channel MOS transistors has a gate terminal to receive a first analog input voltage signal A_INA_P. The first MOS transistor is configured to generate an output current flowing in a bit line BL in response to the first analog input voltage signal A_INA_P in combination with the digital input signal D_INB. A second MOS transistor of the differential pair of n-channel MOS transistors has a gate terminal to receive a second analog input voltage signal A_INA_N. The second MOS transistor is configured to generate an output current flowing in a bit line bar BLB in response to the second analog input voltage signal A_INA_N in combination with the digital input signal D_INB.

The variable resistor R is programmed to a specific value before operating the multiplier. Thus, when a digital input voltage signal D_INB is high to turn on the switching transistor, a differential output current taken as a difference between two current flows in the pair of bit lines (BL and BLB) can be proportional to a multiplication result of the analog voltage input signal A_INA and the inverse of a preset resistance value of a variable resistor R or its conductance value. On the other hand, when a digital input voltage signal D_INB is low to turn off the switching transistor, the output current OUT can be reduced to a trivial level. That is, when the low value of the digital input signal D_INB to be received by the switching transistor is reduced to a trivial level, the switching transistor is then kept in the non-conducting condition with certainty.

FIG. 17(a) shows the pair of MOS transistors D1 and D2 having a common source terminal connected to a first end of a variable resistor R. The transistor D1 connects a bit line BL to the first end of the variable resistor R. The transistor D2 connects a bit line bar BLB to the first end of the resistor R. A second end of the variable resistor R is connected to a drain of a switching transistor S1. The switching transistor S1 has a gate terminal for receiving a digital input voltage signal D_INB and a source terminal connected to a common source line CSL. The switching transistor S1 is configured to activate or deactivate the current flows (O_P, O_N) in a pair of bit lines (BL and BLB) in response to a digital input voltage signal D_INB.

FIG. 17(b) shows a differential analog multiplier circuit 1740 having a pair of MOS transistors D3 and D4, each having a common source terminal connected to a drain terminal of a switching transistor S2. The switching transistor S2 connects the MOS transistors D3 and D4 to a variable resistor R such that the switching transistor S2 activates or deactivates the output current flows in the bit lines BL and BLB in response to receiving a digital input voltage signal D_INB that are applied to a gate region of the switching transistor S2. The resistor R connects the switching transistor S2 and the common source line CSL.

FIG. 17(c) shows a differential analog multiplier circuit 1760 configured in a cascode configuration. In FIG. 17(c), the differential analog multiplier circuit includes MOS transistors D5 and D6 that are connected to corresponding switching transistors S3 and S4, respectively. Namely, the drains of the transistors D5 and D6 are connected to sources of the transistors S3 and S4, respectively. The gates of the transistors S3 and S4 are tied together and configured to receive a digital input voltage signal D_INB. The common source terminal of the pair transistors D5 and D6 is connected to one end of variable resistor R. A gate terminal of the transistor D5 is configured to receive an analog input voltage signal A_INA_P from a first analog voltage source node. A gate terminal of the transistor D6 is configured to receive an analog input voltage signal A_INA_N from a second analog voltage source node. A bit line BL is connected to the transistors S3 and D5 in series, and a bit bar line BLB is connected to the transistors S4 and D6 in series. Each source terminal of switching transistors S3 and S4 and a drain terminal of each of the transistors D5 and D6 are joined together to form a common source/drain region. Each switching transistors S3 and S4 have a gate terminal for receiving a digital input voltage signal D_INB such that the switching transistors S3 and S4 activate or deactivate the output current flows in the bit lines BL and BLB in response to receiving digital input voltage signal D_INB applied to a gate region of the switching transistors S3 and S4.

Figure 18:
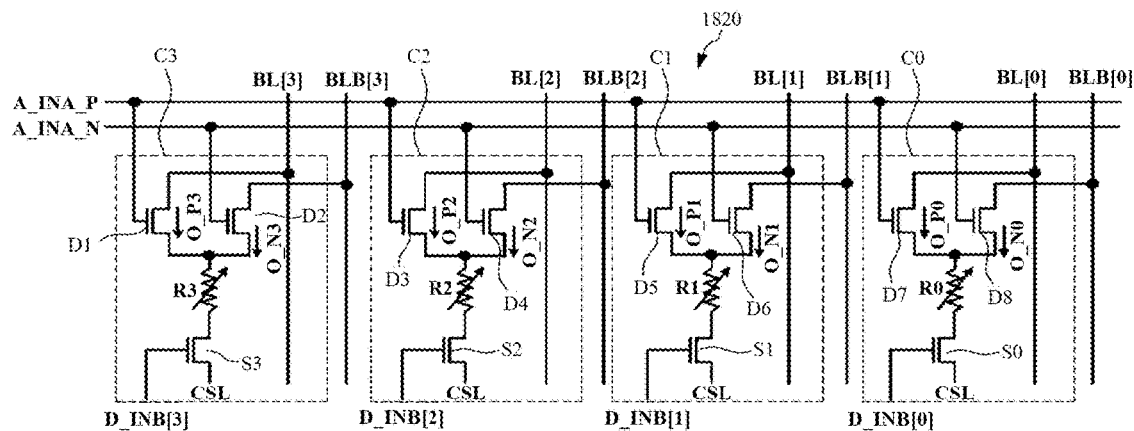
FIG. 18 is a schematic representation of an analog multiplier circuit array according to one embodiment.
Figure 18:
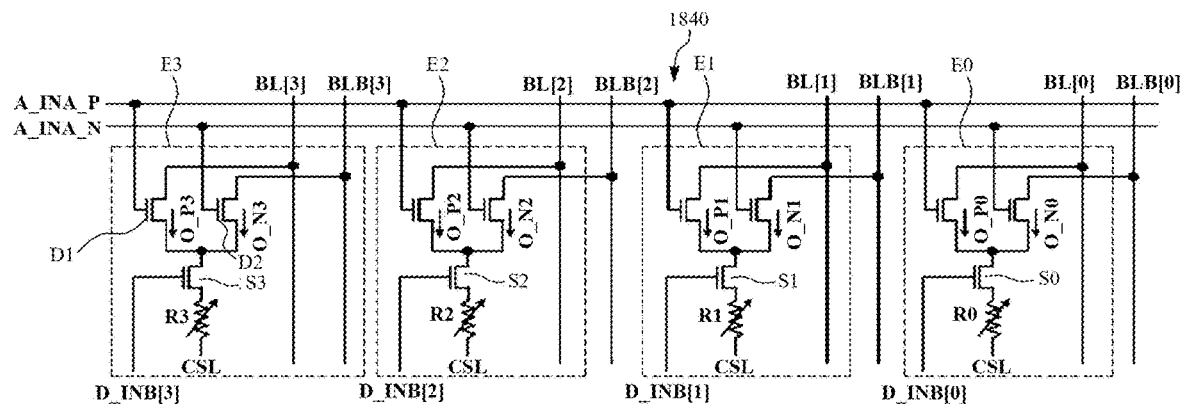
Figure 18:
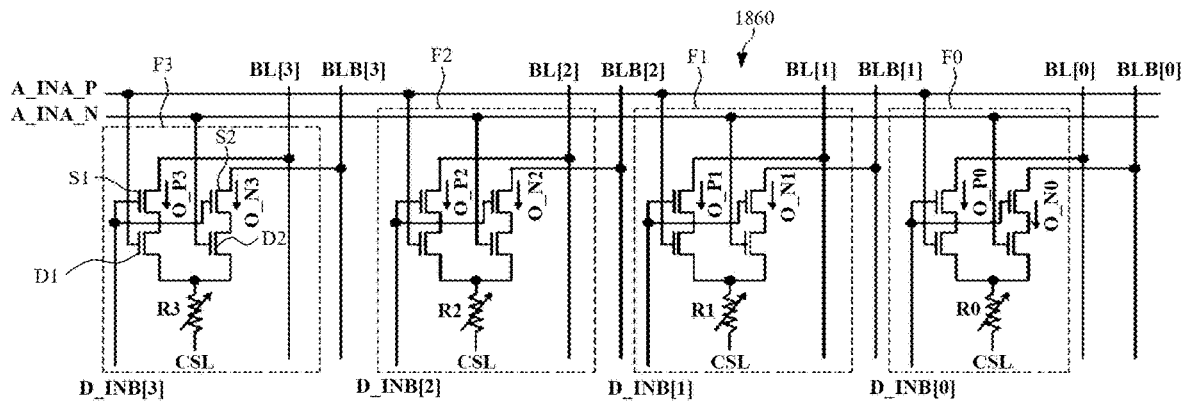

FIG. 18 is a schematic representation of an analog multiplier circuit array according to one embodiment. FIG. 18(a) shows a circuit array 1820 including four pairs of analog multiplier circuits C1, C2, C3 and C4, each connected to a pair of voltage source nodes for receiving analog voltages A_INA_P and A_INA_N. Each analog multiplier includes a differential pair of MOS transistors. The first transistors D1, D3, D5 and D7 within a set of the paired transistors are configured to receive an analog input voltage A_INA_P on their gate terminals, respectively. The second transistors D2, D4, D6 and D8 within the set of the pair transistors are configured to receive analog input voltage A_INA_N on their gate terminals, respectively.

The pair of MOS transistors in each circuit C3, C2, C1 and C0 have a common source terminal connected to a variable resistor R connected to a switching transistor. Four variable resistors R3, R2, R1 and R0 connect the pairs of transistors D1/D2, D3/D4, D5/D6 and D7/D8 to a drain terminal of the four switching transistors S3, S2, S1 and S0, respectively. Each variable resistor R3, R2, R1 and R0 has been programmed to target specific values, respectively. The switching transistors S3, S2, S1 and S0 coupled with the variable resistors R3, R2, R1 and R0, respectively, activate or deactivate the output current flows in four pairs of bit lines BL[3]/BLB[3], BL[2]/BLB[2], BL[1]/BLB[1] and BL[0]/BLB [0] in response to unsigned digital voltage inputs D_INB[3], D_INB[2], D_INB[1] and INB[0] received on their gates, respectively. The analog multiplier circuits C3, C2, C1, and C0 can be used in that digital voltage inputs D_INB[3] represents the most significant bit and D_INB[0] represents the least significant bit.

Once activated, each multiplier circuit C3, C2, C1 and C0 enable a pair of current flows (O_P and O_N) in the BL and BLB nodes. Differential output current is calculated based on a difference between the current flow in BL node and the current flow in BLB. The amount of current flow in the each of the bit line BL nodes is a multiplication product of an input voltage signal (operand X) and an inverse of the pre-programmed corresponding resistor R (operand Y) when the switching transistors S3, S2, S1, and S0 are turned on. The four switching transistors S3, S2, S1, and S0 are configured to enable or disable current flows (O3~O0) in four pairs of bit lines BL[3]/BLB[3], BL[2]/BLB[2], BL[1]/BLB [1], and BL[0]/BLB[0] in response to the unsigned digital input voltages D_INB[3], D_INB[2], D_INB[1], and INB[0] received on their gates, respectively, respectively.

Four differential output currents (O_P3-O_N3), (O_P2-O_N2), (O_P1-O_N1), (O_P0-O_N0) can be scaled with reference to a magnitude of a first differential output current (O_P0-O_N0). As an integer number, when a scaling factor K is set to 2 with reference to the first bit output current (O_P0-O_N0) with a magnitude value of 1, the magnitude of differential output of the remaining bits (O_P3-O_N3), (O_P2-O_N2), (O_P1-O_N1), (O_P0-O_N0) will reach values of 8, 4, 2, and 1. Setting a scaling factor is to accurately distinguish one from other output currents on the bit lines. Thus, the differential output (O_P-O_N) in each multiplier circuit in the array is proportional to a multiplication result between a targeted preset differential value (A_INA_P-A_INA_N) and the inverse resistance values R3~R0 when the four D_INB bits are high for turning on the selection transistor. On the other hand, when "low" digital input voltage signals (D_INB[3], D_INB[2], D_INB[1], D_INB [0]) deactivate the switching transistors (C1, C2, C3, and C4), the amounts of output currents O_P3~0 and O_N3~0 can be reduced to a trivial level.

FIG. 18(b) shows a circuit array 1840 including four pairs of analog multiplier circuits E3, E2, E1 and E0, each multiplier circuit connected to a pair of voltage source nodes providing analog voltages (A_INA_P and A_INA_N), wherein each of the four pairs of analog multipliers is described in FIG. 17(b). Switching transistors S3, S2, S1 and S0 connect differential amplifier circuits to four variable resistors R3, R2, R1, and R0 such that the switching transistors S3, S2, S1 and S0 activate or deactivate the output current flows in four pairs of bit lines BL[3]/BLB [3], BL[2]/BLB [2], BL[1]/BLB [1], and BL[0]/BLB[0] in response to unsigned digital voltage inputs D_INB[3], D_INB[2], D_INB[1], and INB[0] received on their gates.

FIG. 18(c) shows a circuit array 1860 including four pairs of analog multiplier circuits F3, F2, F1 and F0, each multiplier circuit connected to a pair of voltage source nodes for providing analog voltages (A_INA_P and A_INA_N), wherein each pair of the four pairs of analog multipliers is described in FIG. 17(c). As discussed in FIG. 17(c), each circuit F3, F2, F1 and F0 are configured in a cascode configuration. Namely, the circuit F3 includes MOS transistors D1 and D2 that are connected to corresponding switching transistors S1 and S2. The switching transistors S1 and S2 are also MOS transistors connected to the corresponding transistors D1 and D2. Specifically, the drains of the transistors D1 and D2 are connected to the corresponding sources of the transistors S1 and S2. The gates of the transistors S1 and S2 are tied together and configured to receive a digital input voltage signal D-INB[3].

FIG. 18(c) shows a circuit array 1860 including four pairs of analog multiplier circuits F3, F2, F1 and F0, each multiplier circuit connected to a pair of voltage source nodes for providing analog voltages (A_INA_P and A_INA_N), wherein each pair of the four pairs of analog multipliers is described in FIG. 17(c). As discussed in FIG. 17(c), each circuit F3, F2, F1, and F0 are configured in a cascode configuration. Namely, the circuit F3 includes MOS transistors D1 and D2 connected to corresponding switching transistors S1 and S2.

The switching transistors S1 and S2 are also MOS transistors connected to the corresponding transistors D1 and D2. Namely, the drains of the transistors D1 and D2 are connected to the corresponding sources of the transistors S1 and S2. The gates of transistors S1 and S2 are tied together and configured to receive a digital input voltage signal D_INB[3]. The common source terminal of the pair transistors D1 and D2 are connected to one end of variable resistor R. A gate terminal of the transistor D1 is configured to receive an analog input voltage signal A_INA_P from a first analog voltage source node. A gate terminal of the transistor D2 is configured to receive an analog input voltage signal A_INA_N from a second analog voltage source node. A bit line BL[3] is connected to the transistors S1 and D1 in series, and a bit bar line BLB [3] is connected to the transistors S2 and D2 in series. Each source terminal of switching transistors S1 and S2 and a drain terminal of each of the transistors D1 and D2 are joined together, respectively, to form a common source/drain region. Each switching transistors S1 and S2 have a gate terminal for receiving a digital input voltage signal D_INB[3] such that the switching transistors S3 and S4 activate or deactivate the output current flows in the bit lines BL and BLB in response to receiving digital input voltage signal D_INB applied to a gate region of the switching transistors S3 and S4. The other circuits, F2, F1, and F0, have an identical structure as the F3 circuit, and they receive different digital input voltage signals D_INB[2], D_INB[1], and D_INB[0].

Figure 19:
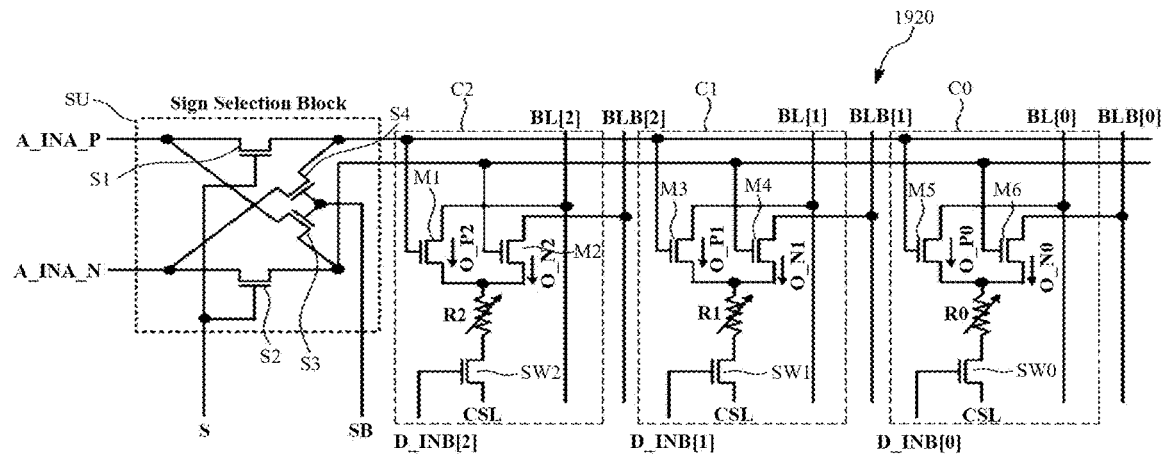
FIG. 19 is a schematic representation of an analog multiplier circuit array according to one embodiment.
Figure 19:
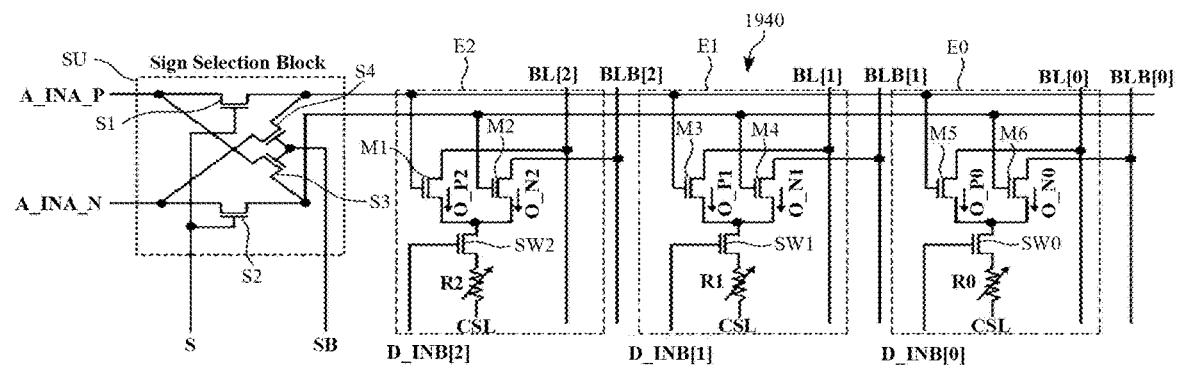
Figure 19:
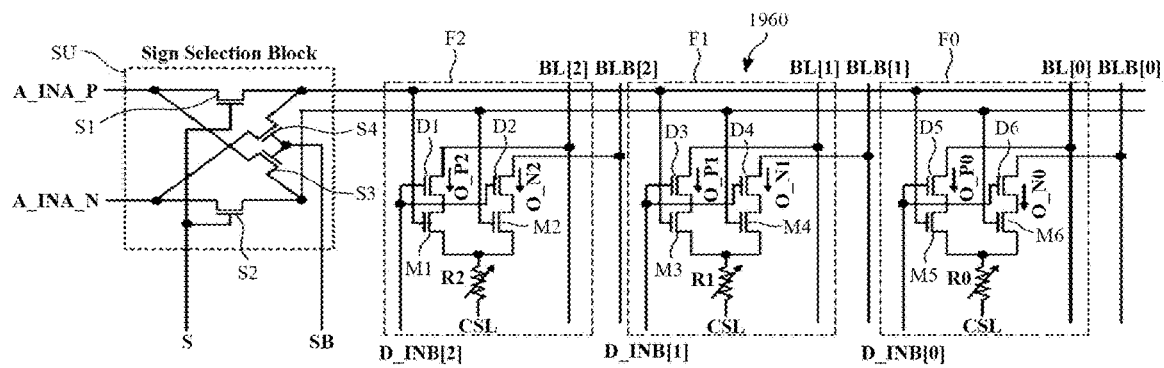

FIG. 19 is a schematic representation of an analog multiplier circuit array according to one embodiment. Here, the analog multiplier circuit array configured with a plurality of MOS transistors. The analog multiplier circuit arrays each 1920, 1940 and 1960 include one sign selection circuit SU and three multiplier units. The analog multiplier circuits in each array 1920, 1940 and 1960 generate a plurality of paired current O_P2/O_N2, O_P1/O_N1 and O_P0/O_N0 flowing in a plurality of paired bit lines BL2/BLB2, BL1/BLB1 and BL0/BLB0, respectively. The sign selection circuit SU includes a first pair of MOS transistors S1, S2 and a second pair of MOS transistors S3 and S4.

In FIG. 19(a), a sign selection unit SU includes four MOS transistors S1, S2, S3 and S4 in which a gate of each of MOS transistors S1 and S2 is configured to receive a digital control signal S and a gate of each of MOS transistors S3 and S4 is configured to receive a digital signal SB that is complementary to the digital control signal S. In the selection unit SB, the two pairs of transistors S1/S2 and S3/S4 are configured to operate such that (1) an activated first pair of transistors S1 and S2 enable a supply of a first analog input signal A_INA_P to the first transistors of a set of differential pairs of two transistors M1, M3 and M5, and a supply of a second analog input signal A_INA_N to the second transistors of the set of differential pairs of two transistors M2, M4 and M6, or such that (2) an activated second pair of transistors S3 and S4 enable the supply of the first analog input signal A_INA_P to the second transistors of the set of differential pairs of two transistors M2, M4 and M6, and a supply of the second analog input signal A_INA_N to the first transistors of the set of differential pairs of two transistors M1, M3 and M5, depending on a status of the complimentary sign signals S and SB. The magnitude difference of the current flows in the bit lines BL and BLB is proportional to the differential voltage input signal applied to each transistor (M1~M6).

The first pair of transistors S1 and S2 in the sign selection circuit SU are configured to be activated by receiving an activation signal S on their gate. The second pair of transistors S3 and S4 in the sign selection circuit SU is configured to be activated by receiving an activation signal SB on their gate. The activation signal S and the activation signal SB are correlated with one another such that (1) when the signal S becomes a high-digital level, then the signal SB becomes a low digital signal and (2) when the signal SB becomes a high-digital level, then the signal S becomes a low digital signal. As a result, a pair of MOS transistors in each analog multiplier circuit is driven to the A_INA_P or A_INA_N input by the two pairs of transistors in the sign selection unit.

When the sign signal S is high, and the signal SB is low, the high S signal (1) turns on the transistor S1 that enables A_INA_P to activate the transistors M1, M3 and M5 such that the currents O_P2, O_P1 and O_P0 flow in the bit lines BL[2], BL[1] and BL[0], respectively, and (2) turns on the transistor S2 that enables A_INA_N to activate the transistors M2, M4 and M6 such that the currents O_N2, O_N1, and O_N0 flow in the bit lines BLB[2], BLB[1] and BLB[0], respectively. Likewise, when the sign signal SB is high, and the signal S is low, the high SB signal (1) turns on the transistor S3 that enables A_INA_P activates the transistors M2, M4, and M6 such that the currents O_N2, O_N1, and O_N0 flow in the bit lines BLB[2], BLB[1] and BLB[0], respectively, and (2) turns on the transistor S4 that enables A_INA_N to activate the transistors M1, M3 and M5 such that the currents O_P2, O_P1, and O_P0 flow in the bit lines BL[2], BL[1] and BL[0], respectively. The differential current output generated by the pair of transistors M1/M2, M3/M4, and M/5/M6 in each multiplier is determined by subtracting the amount of current flows through BLB2, BLB1, and BLB0 from the amount of current flow through BL2, BL1, and BL0, respectively.

On the other hand, when a "low" digital input voltage signals D_INB[2], D_INB[1] and D_INB[0] deactivate the switching transistors SW2, SW1 and SW0, the amounts of output currents (O_P2-O_P0 and O_N2-O_N0) in the corresponding bitlines (BL[2]~BL[0], BLB[2]~BL[0]) can be reduced to a trivial level.

The variable resistance circuits R2, R1 and R0 are programmed to specific values before operating the circuit. Three differential output currents (O_P2-O_N2), (O_P1-O_N1), (O_P0-O_N0) can be scaled with reference to a magnitude of a first differential output current (O_P0-O_N0). As an integer number, when a scaling factor K is set to 2 with reference to the first-bit output current (O_P0-O_N0) with a magnitude value of 1, the magnitude of differential output of the remaining bits (O_P2-O_N2), (O_P1-O_N1), (O_P0-O_N0) will reach values of 4, 2 and, 1.

Setting a scaling factor is to distinguish one from other output currents accurately. Thus, the differential output (O_P-O_N) in each of the three multiplier circuits in the array is proportional to a multiplication result between a targeted preset differential value (A_INA_P-A_INA_N) and the inverse resistance values R2~R0 when the S becomes high for turning on the selection transistor. On the other hand, when a "low" digital signals (D_INB[2], D_INB[1], D_INB[0]) deactivate the switching transistors SW2, SW1 and SW0, and the amounts of output currents (O_P2~0 and O_N2~0) can be reduced to a trivial level.

FIG. 19(b) shows an analog multiplier circuit array 1940 including the sign selection unit SU as described in FIG. 19(a) and three pairs of analog multiplier circuits E2, E1 and E0, each circuit connected to a pair of voltage source nodes providing analog voltages A_INA_P and A_INA_N, wherein the analog multipliers is described in FIG. 17(b). Switching transistors SW2, SW1, SW0 connect differential amplifier circuits to three variable resistors R2, R1 and R0 such that the switching transistors SW2, SW1 and SW0 activate or deactivate the output current flows in three pairs of bit lines BL[2]/BLB [2], BL[1]/BLB [1] and BL[0]/BLB [0] in response to unsigned digital voltage inputs D_INB[2], D_INB[1] and INB[0] received on their gates. FIG. 19(c) shows an analog multiplier circuit array 1940 including the sign selection unit SU as described in FIG. 19(a) and three pairs of analog multiplier circuits F2, F1 and F0, each circuit connected to a pair of voltage source nodes providing analog voltages A_INA_P and A_INA_N, wherein the analog multipliers is described in FIG. 17(c).

Figure 20:
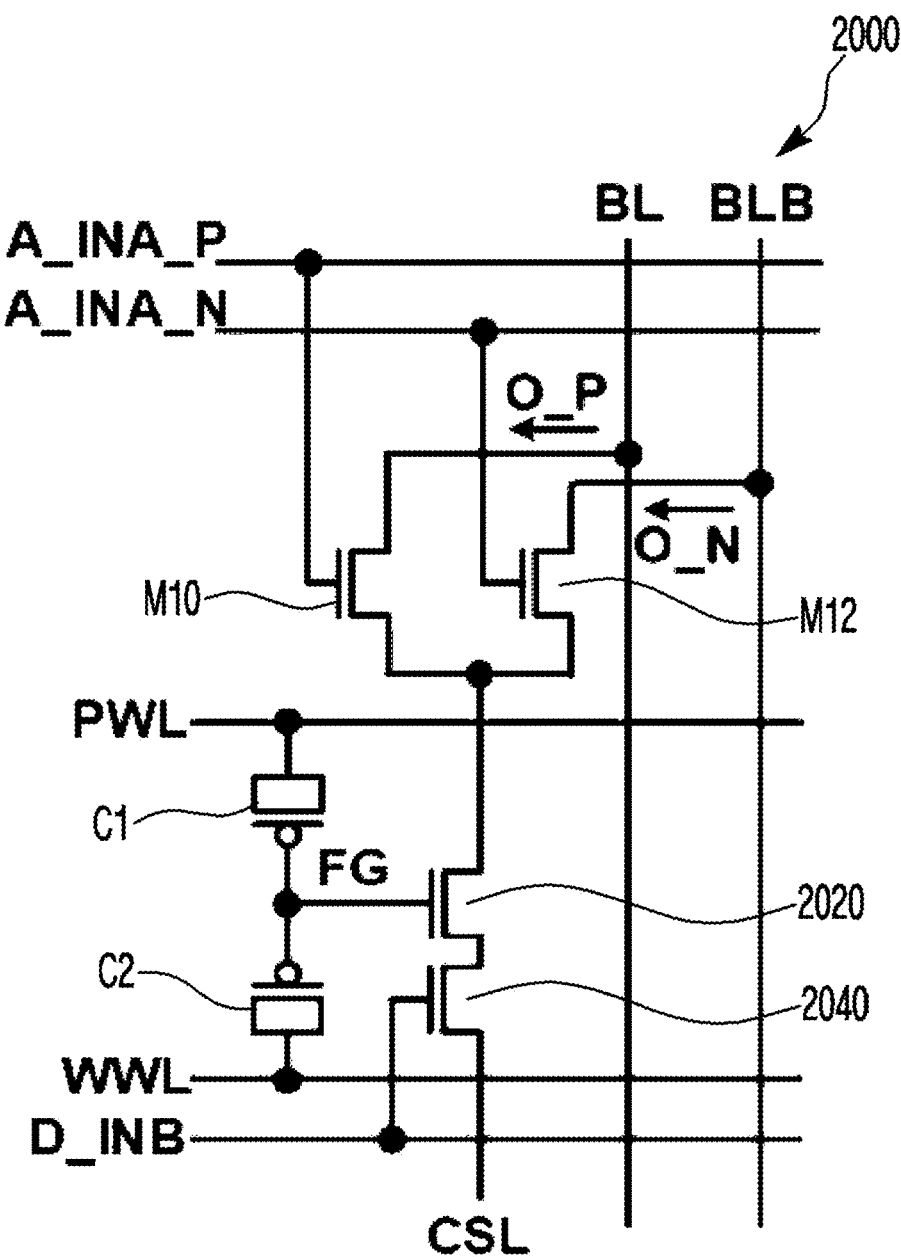
FIG. 20 is a schematic circuit diagram of a differential analog multiplier with a logic compatible flash memory according to one embodiment of the present invention.

FIG. 20 is a schematic circuit diagram of a differential analog multiplier with a logic compatible flash memory according to one embodiment of the present invention. In FIG. 20, the analog multiplier circuit 2000 is configured to receive a pair of differential input analog voltages A_INA_P and A_INA_N and another 1-bit digital input voltage D_INB and produces the resulting differential output current pair O_P and O_N to a pair of bit lines BL and BLB. This multiplier is a combination of the pair of differential MOS transistors in FIG. 17 and the variable resistor R is described in FIG. 14. The differential pair of MOS transistors includes a pair of MOS transistors M10, M12 sharing a common source connected to a drain terminal of a read transistor 2020 that has a control gate connected to a pair of coupling transistors C1 and C2 through a floating gate (FG) as a charge storage node. A pair of differential transistors M10 and M12 receive a pair of differential analog input voltages A_INA_P and A_INA_N, respectively.

The read transistor 2020 has a gate connected to a pair of coupling transistors C1 and C2 through each of the floating gate nodes FG as a charge storage node. The coupling transistor C1 is connected to a program word line PWL for providing a program voltage to the floating gate. The coupling transistor C2 is connected to a write word line WWL for data write operation. A drain of a switching transistor 2040 is connected to a source of the read transistor 2020, and a source of the switching transistor 2040 is connected to a common source line (CSL). The switching transistor 2040 is configured to enable or disable a flow of current in the bit line in response to the digital input voltage D_INB applied to a gate region of the switching transistor 2040.

The FG node voltage can be pre-programmed to the targeted specific value and when D_INB is high for turning "on" the selection transistor, the amount of the differential output current (O_P O_N) can be proportional to the multiplication between a preset differential input voltage (A_INA_P-A_INA_N) and conductance of the read transistor 2020 of the logic compatible flash memory. On the other hand, the current flow (OUT) can be reduced to a trivial level when D_INB is low for turning off the selection transistor. Although a specific number of the read transistors or the selection transistors are shown, it should be understood that any number of the read transistors and/or the selection transistors can be serially connected.

Figure 21:
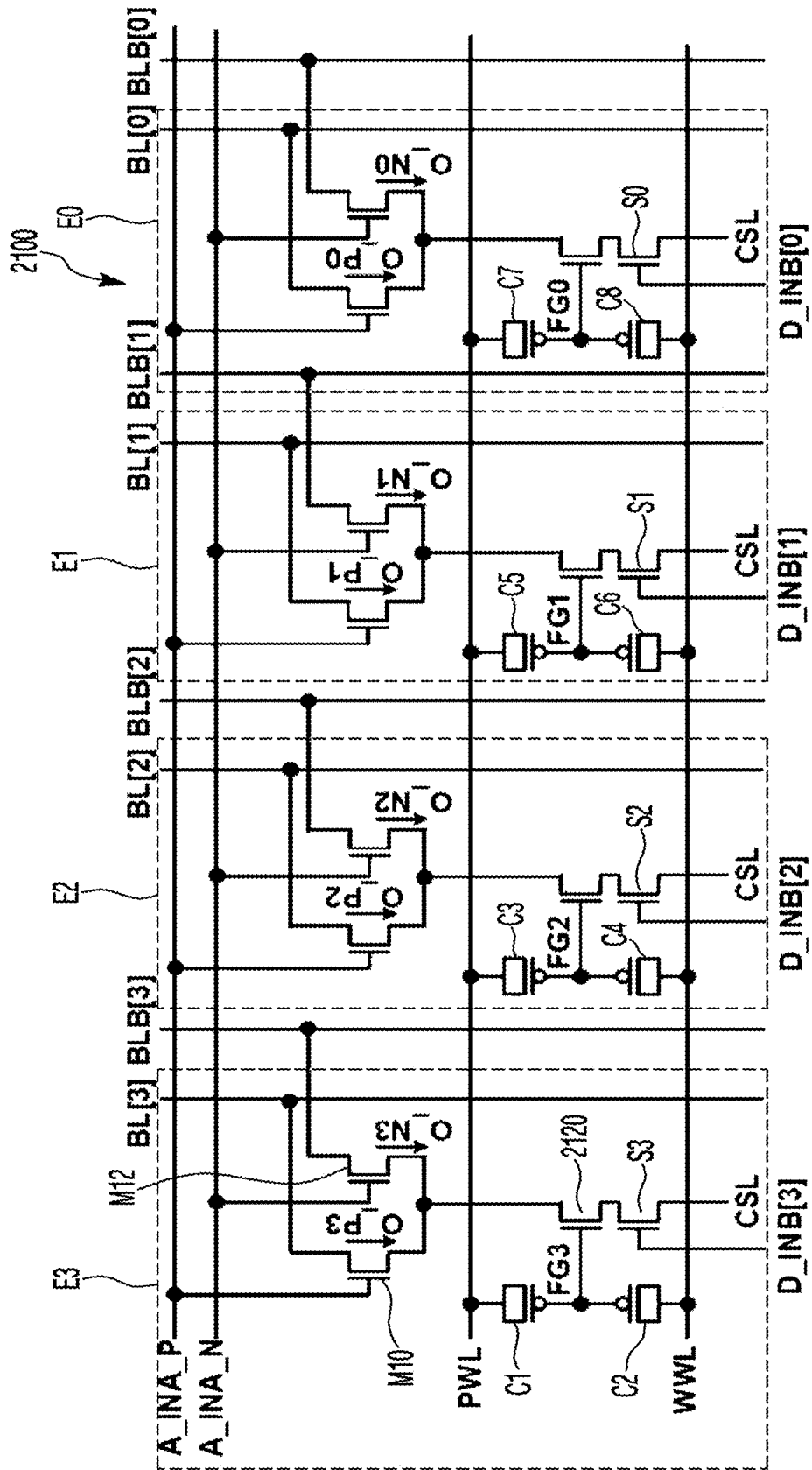
FIG. 21 is a schematic representation of a differential analog multiplier array according to one embodiment.

FIG. 21 is a schematic representation of a differential analog multiplier array 2100 according to one embodiment. In FIG. 21, a pair of differential input source lines for providing A_INA_P and A_INA_N are connected to four analog multipliers. Each of four differential analog multipliers with a logic compatible flash memory in the array is described above in FIG. 20. A program word line PWL for providing a program voltage to floating gates FG3, FG2, FG1 and FG0 is connected to a first coupling transistor in each logic compatible flash memory. A write word line WWL for data operation is connected to a second coupling transistor in the logic compatible flash memory. The switching transistors S3, S2, S1 and S0 are configured to enable or disable the four pairs of current flows in the bit lines BL[3]/BLB[3], BL[2]/BLB[2], BL[1]/BLB[1] and BL[0]/BLB[0] in response to the digital input voltages D_INB[3], D_INB[2], D_INB[1] and D_INB[3]. The FG node voltages FG3, FG2, FG1 and FG0 have been programmed to specific values. In other words, the magnitude of currents (O_P3-O_N3), (O_P2-O_N2), (O_P1-O_N1) and (O_P0-O_N0) can be scaled with reference to the magnitude of output current (O_P0-O_N0).

A scaling factor K is an integer number, and when K is set to 2 with reference to the output current (O_P0-O_N0) having a magnitude value of 1, the magnitude of the output currents (O_P3-O_N3), (O_P2-O_N2), (O_P1-O_N1) and (O_P0-O_N0) will reach values of 8, 4, 2 and 1. Setting a scaling factor is to accurately distinguish one from other output currents on the bit lines. The current flow in the bit line is a multiplication product between a preset input voltage signal (operand X) and conductance of the read transistor (operand Y). Thus, the differential output (O_P-O_N) in each multiplier circuit in the array is proportional to a multiplication product between a targeted preset differential value (A_INA_P-A_INA_N) and the conductance of the NMOS devices connected to the FG3, FG2, FG1 and FG 0 nodes when the four D_INB bits are high for turning "on" the selection transistor. On the other hand, when any one of the digital input voltage signals D_INB[3], D_INB[2], D_INB[1] and D_INB[0] becomes low to turn off the corresponding switching transistor, the output current (OUT) can be reduced to a trivial level. That is, when D_INB is low, the switching transistor is then kept in the non-conducting condition with certainty, and the amounts of current flow in corresponding bit lines can be reduced to a trivial level.

Figure 22:
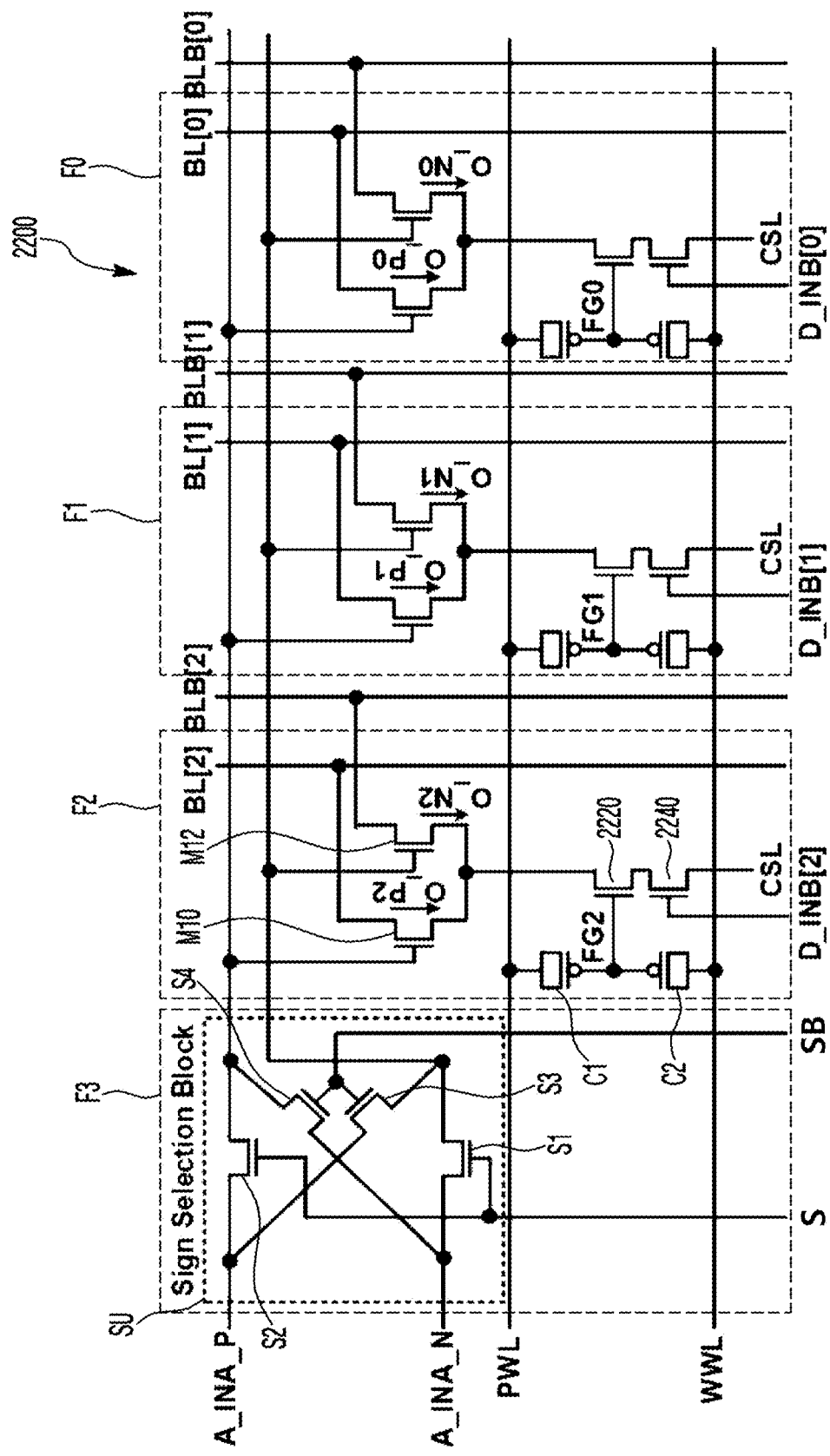
FIG. 22 is a schematic representation of a differential analog multiplier array according to one embodiment.

FIG. 22 is a schematic representation of a differential analog multiplier array according to one embodiment. The analog multiplier circuit array 2200 includes one sign selection unit and three multiplier units. The sign selection unit is described in FIG. 19, and the analog multiplier circuit is described in FIG. 20. The multiplier circuits in the array generate a plurality of paired current flows (O_P2/O_N2~O_P0/O_N0) in a plurality of a pair bit lines (BL2/BLB2~BL0/BLB0), respectively. The sign selection unit includes a first pair of transistors S1 and S2 and a second pair of transistors S3 and S4.

The magnitude of a current flowing in the bit line is proportional to the voltage input signal applied to the transistor. The current (O_P2~0) generated in response to A_INA_P flows in a bit line (BL2~0) and the current (O_N2~0) generated in response to A_INA_N flows in the bit bar line (BLB2~0) when the sign signal S is high. The currents (O_P2~0) generated in response to A_INA_N flows in a bit line (BL2~0) and the current (O_N2~0) generated in response to A_INA_P flows in the bit bar line (BLB2~0) when the sign signal S is low. The differential current output generated by the pair of transistors in each multiplier is determined by subtracting the amount of current flow in BLB2~0 from the amount of current flow in BL2~0.

The first pair of transistors S1 and S2 in the sign selection unit is configured to be activated by receiving an activation signal S on their gate. The second pair of transistors S3 and S4 in the sign selection unit is configured to be activated by receiving an activation signal SB on their gate. The activation signal S and the activation signal SB are correlated with one another such that (1) when the signal S becomes a high-digital level, then the signal SB becomes low digital level and (2) when the signal SB becomes a high-digital level, then the signal S becomes low digital level. As a result, a pair of MOS transistors in each analog multiplier circuit are driven to the A_INA_P or A_INA_N input by the two pairs of transistors in the sign selection unit.

When the first pair of MOS transistors S1 and S2 are enabled with high digital signal S, the input analog voltage (A_INA_P) is connected to the upper input line of the three analog multiplier unit, and the other input analog voltage (A_INA_N) is connected to the lower input line of the three analog multiplier units. Likewise, when the second pair of MOS transistors (S3 and S4) are enabled with high digital signal SB, the input analog voltages (A_INA_P) is connected to the lower input line of the three analog multiplier units, and the other input analog voltage and (A_INA_N) is connected to the high line of the three analog multiplier units.

Therefore, when the S is high, the SB becomes low, and then A_INA_P and A_INA_N are supplied to the gates of the corresponding pair of NMOS transistors through the higher and lower input lines by the activated NMOS transistors. Thus, the paired transistors enable a flow of current O_P2~0 and O_N2~0, respectively. When the S is low, the SB becomes high, then A_INA_P and A_INA_N are supplied to the gate of the corresponding pairs of NMOS transistors through the lower and higher input lines by the activated NMOS transistors. Thus, the paired transistors enable a flow of current flows O_N2~0 and O_P2~0, respectively. On the other hand, when any one of the digital input voltage signals D_INB[2], D_INB[1] and D_INB[0] becomes low to turn off the corresponding switching transistor, the output currents (O_P2~O_P0 and O_N2~O_N0) can be reduced to a trivial level. That is, when D_INB is low, the switching transistor is then kept in the non-conducting condition with certainty, and the amounts of current flow in corresponding bit lines reduce to a trivial level.

Figure 23:
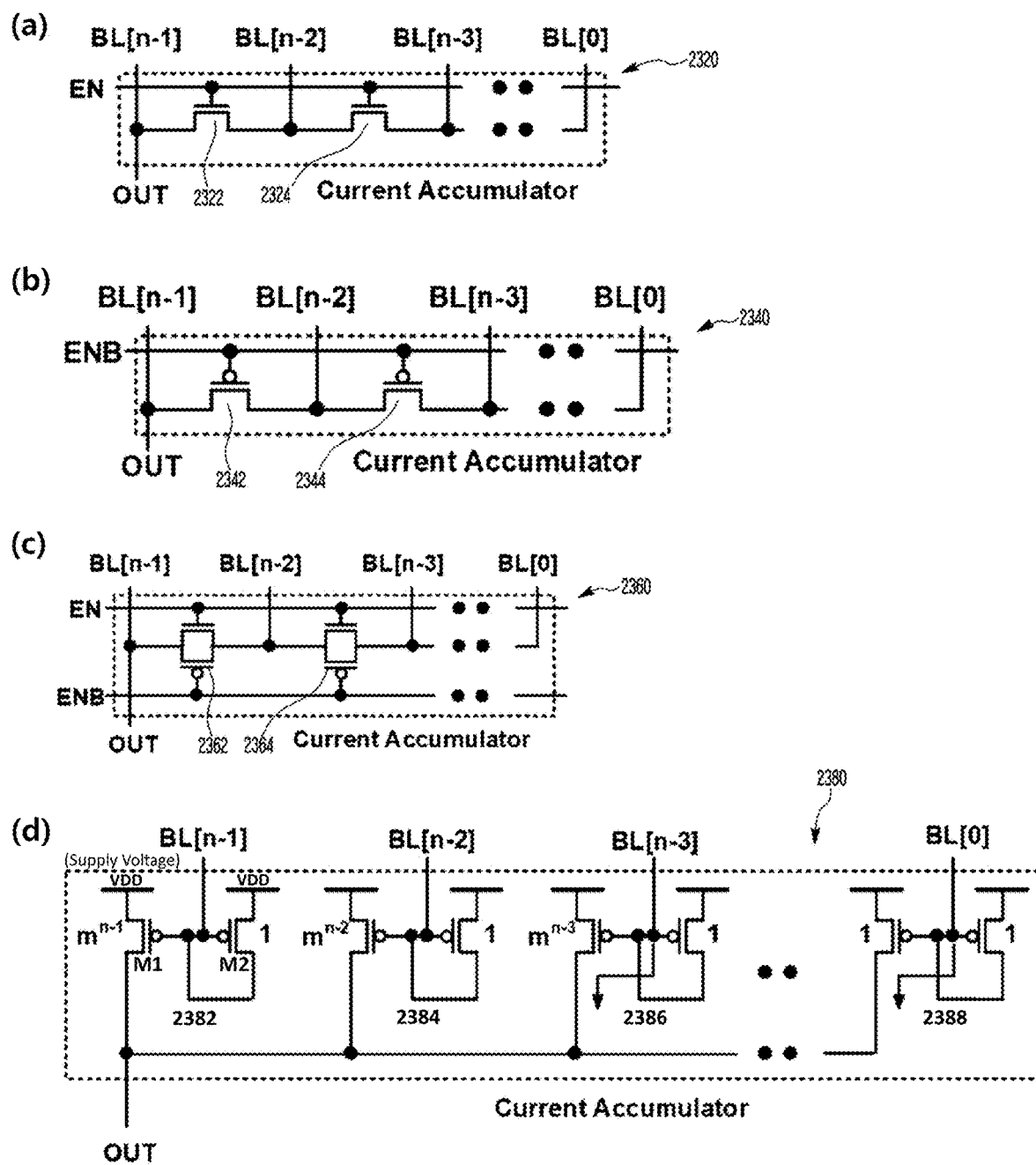
FIG. 23 shows the exemplary analog accumulator circuits according to the present invention.

FIG. 23 shows some exemplary analog accumulator circuits according to the present invention. FIG. 23(a) shows one exemplary current accumulator circuit 2320 including a plurality of N-MOS transistors. Each of the transistors (2322, 2324, etc.) is connected to an internal enable node EN via its control terminal and connected to bit lines BL[n−1], BL[n−2], BL [n−3] . . . BL[0] through its drain and source terminals. Thus, the transistors (2322, 2324, etc.) can accumulate the flow of currents in each bit lines BL[n−1], BL[n−2], BL[n−3] . . . BL[0] to the one OUT node in response to receiving a high-level signal from EN node. Likewise, the transistors can disable the flow of currents in the bit lines BL[n−1], BL[n−2], BL[n−3] . . . BL[0] to the OUT node in response to receiving a low-level signal from EN node.

FIG. 23(b) shows one exemplary current accumulator circuit 2340 having a plurality of P-MOS transistors. Each of the transistors (2342, 2344, etc.) is connected to an internal enable node via its control terminal and connected to bit lines through its drain and source terminals. Thus, the transistors (2342, 2344, etc.) can accumulate the flow of currents in each bit lines BL[n−2], BL [n−3] . . . BL[0] to the one OUT node in response to receiving a low-level signal from ENB node. Likewise, the transistors can disable the flow of currents in the bit lines BL[n−2], BL [n−3] . . . BL[0] to the OUT node in response to receiving a high-level signal from ENB node FIG. 23(c) shows one exemplary current accumulator 2360 circuit having a plurality of CMOS-type transistors. A first control gate of CMOS transistors (2362, 2364, etc.) is connected to an EN node. A second control gate of the CMOS transistors (2362, 2364, etc.) is connected to the ENB node. And a gate and drain terminal of the CMOS transistors (2362, 2364, etc.) is connected to a plurality of bit lines BL[n−1], BL[n−2], BL[n−3] . . . BL[0]. Thus, the CMOS transistors (2362, 2364, etc.) activated by a high-level signal from the EN node and a low-level signal from the ENB node accumulate the flow of currents in the bit lines BL[n−2], BL[n−3] . . . BL[0] to the one OUT node. Likewise, the transistors (2362, 2364, etc.) activated by a low-level signal from the EN node and a high-level signal from the ENB node disable the flow of currents in the bit lines to the OUT node.

FIG. 23(d) shows one exemplary current accumulator circuit having a plurality of current mirror circuits 2382, 2384, 2386 and 2388, each having a plurality of pairs of PMOS-type transistors. The current mirror circuits each 2382, 2384, 2386 and 2388 have been configured to receive input current 1 in bit lines BL[n−1], BL[n−2], BL[n−3] and BL[0] and provide amplified mirrored currents of $m^{n-1}$, $m^{n-2}$, $m^{n-3}$, and 1 to the other branch and accumulate those currents to the one output node OUT. In the illustrated configuration, the current mirror circuit includes one pair of PMOS transistors: a reference PMOS transistor and a drive PMOS transistor. Gates of the paired drive PMOS transistor M1 and reference PMOS transistor M2 in each circuit 2382, 2384, 2386 and 2388 are connected through each of the common gate node of the transistors. Source terminals of the paired PMOS transistors are connected to supply voltage (VDD). In each circuit, the common gate node is connected to a drain of the transistor M2 and one of the bit lines BL[n−1], BL[n−2], BL[n−3] and BL[0].

The current flow in each bit lines BL[n−1], BL[n−2], BL[n−3] and BL[0] are mirrored to a channel between a drain and source terminals of the transistor M1 with an accumulator scaling factor m (i.e., m=1, 2, 3, etc., an integer number) specified. Then, the amplified mirrored currents are accumulated to the OUT node once enabled. For example, when the resistor scaling factor k is set to 2, the accumulator scaling factor m can be 1 to scale BL current accordingly for the MSBLSB locations of the analog accumulator. When the resistor scaling factor k is set to 1, the accumulator scaling factor m can be 2 to scale BL current accordingly for the MSBLSB locations of the analog accumulator. In this case, the same value of the voltage-controlled variable resistor R can be used in the MSBLSB locations of the analog accumulator. Flash memory or other multi-level cell memory technology is advantageous over other single-bit memory such as ROM, OTP, SRAM, or MRAM since the resistor value from the Flash memory can be tuned after fabrication.

Figure 24:
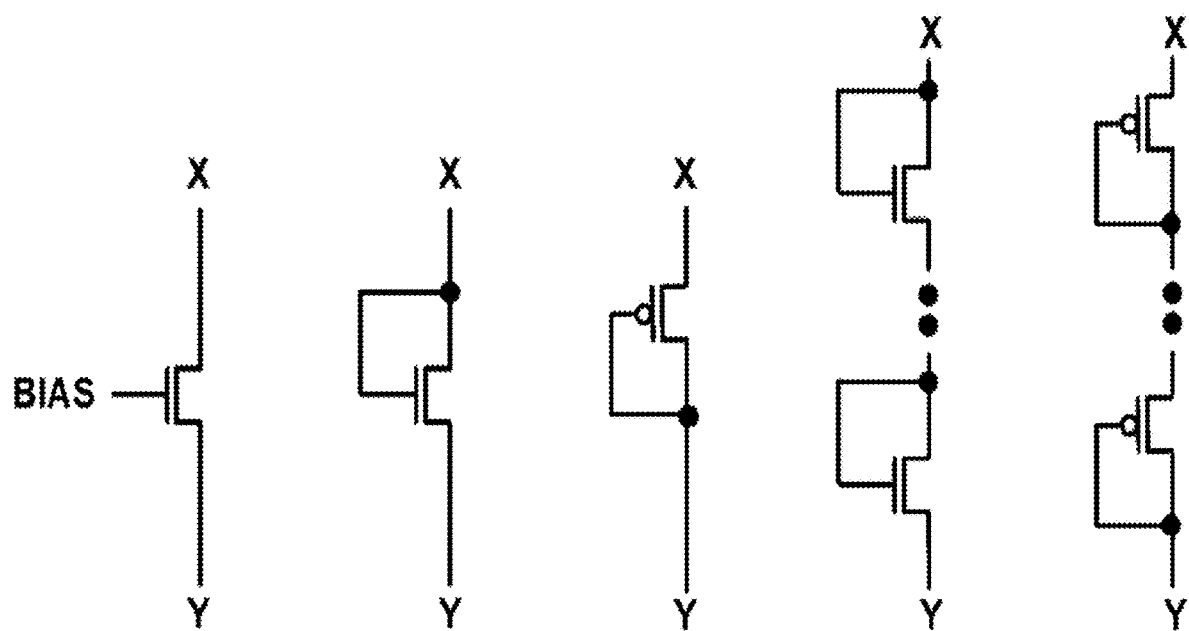
FIG. 24 shows other exemplary resistor R according to the invention. BIAS voltage can be carefully selected to set the transistor operation mode.

FIG. 24 shows other exemplary resistor R according to the invention. A bias voltage can be carefully selected to set the transistor operation mode. Diode connected NMOS or PMOS devices can be used to remove the bias voltage. Multiple diode-connected NMOS or PMOS device can be serially connected too. Transistor sizing is carefully set so that the target resistance value can be represented by the transistor. The W/L ratio of the transistor can be scaled accordingly for different bit locations. Similarly, long wires, poly-gate can be used alternatively to make such resistant devices suitably scaled for different bit line locations from MSB to LSB.

Figure 25:
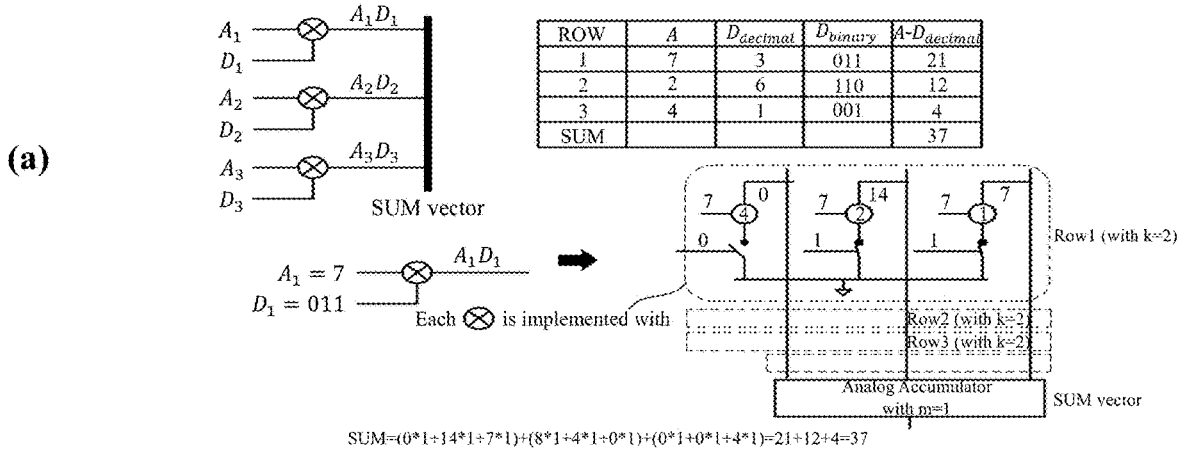
FIG. 25 shows the exemplary calculation with differential scaling factors according to the present invention.
Figure 25:
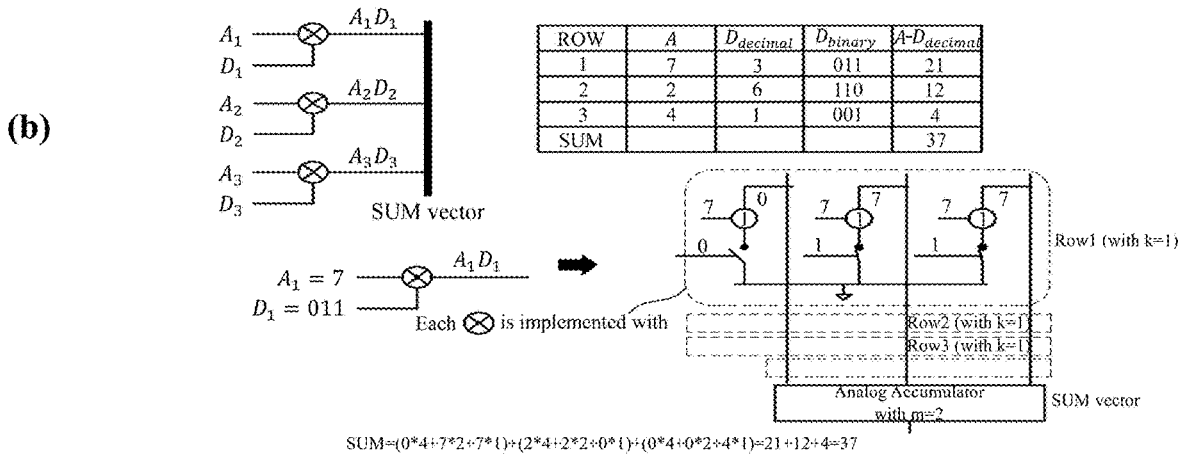
Figure 25:
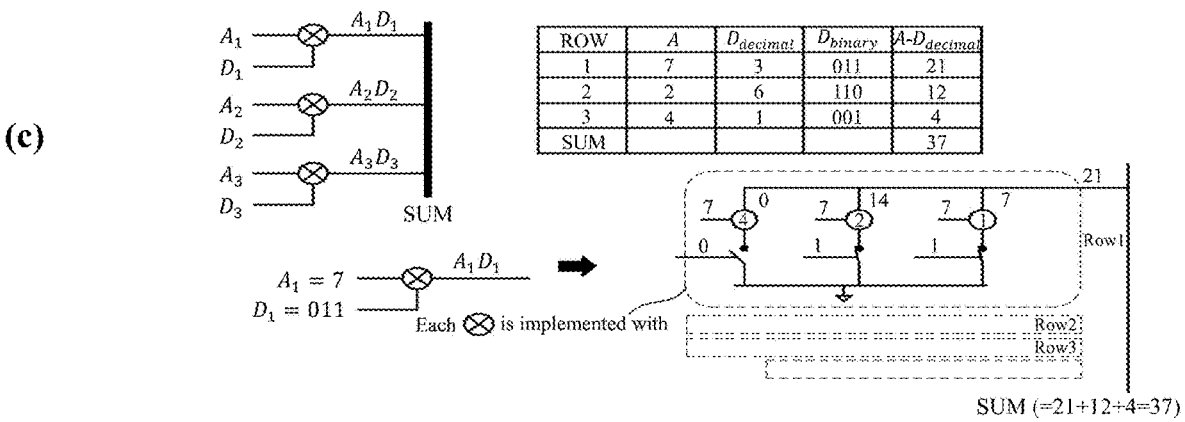

FIG. 25 shows some exemplary operations with scaling factors k and m for computations according to the present invention. Here, conducting the operational steps for producing an output is summarized as follows:
(1) receiving an analog input and digital input data;
(2) calculating a partial output based on the equation: $O_n = Xk^{(n-1)}$, wherein X is an analog input, k is a first programmed scaling factor, and n is a location within a single or multi-digit number;
(3) producing a combined product by multiplying each of partial products to the second digital input data in binary form;
(4) applying a second amplification factors (Pn) to the combined product, wherein $Pn=mO_n$ wherein P is a partial product, m is a second scaling factor;
(5) adding the multiplied partial values to form a partial sum in a row defined;
(6) repeating the steps (3) through (5) for the remaining rows specified; and
(7) generating a total value from all of the sub-values to provide for the analog accumulator.

In FIG. 25(a), conducting the operational steps for producing an output of (7×3)+(2×6)+(4×1) is illustrated. Here at step 1, as operands X, the numbers 7, 2 and 4 are analog inputs (A1, A2, and A3). As operands Y, the numbers 3, 6 and 1 (D1, D2, and D3) are converted to a set of binary numbers (011, 110, 001) to be multiplied. One calculation of X and Y is done in one row, thus, three calculations of elements of X and elements of Y are done through three rows (row 1, row 2 and row 3).

As operands X, the numbers 7, 2 and 4 are analog inputs (A1, A2, and A3). As operands Y, the numbers 3, 6 and 1 (D1, D2, and D3) are converted to a set of binary numbers (011, 110, 001) to be multiplied. One calculation of X and Y is done in one row, thus, three calculations of elements of X and elements of Y are done through three rows (row 1, row 2 and row 3).

At step 2, a set of first amplified outputs {28, 14, 7} are generated by applying the amplification factors (4, 2, 1) to the first input 7. The amplification factors are determined based on the scaling factor 2 with reference to a location within a single or multi-digit number. Thus, a first bit takes 1, a second bit takes 2 and a third bit takes 4 as the amplification factor. At step 3, a set of combined products {0,14,7} is generated by multiplying the first set of binary numbers {0,1,1} to the first set of amplified products {28, 14,7}. At step 4, a second set of amplified products {0,14,7} is generated by multiplying the second factor (m=1) to the first scaled outputs {0, 14, 7}, which remains the same. At step 5, a first partial product 21 is conceived by adding each element of the first combined product {0,14,7} together.

According to step 6, at step 2, a first set of amplified outputs {8, 4, 2} are generated by applying the amplification factors (4, 2, 1) to the second input 2. At step 3, a set of combined products {8,4,0} is generated by multiplying a second set of binary numbers {1,1,0} to the first set of amplified products {8,4,2}. At step 4, a second set of amplified products {8,4,0} is generated by multiplying the second factor (m=1) to the set of combined products {8, 4, 0}, which remains the same. At step 5, a second partial product 12 is conceived by adding each element of the second combined product {8,4,0} together.

According to step 6, at step 3, a first set of amplified outputs {16, 8, 4} are generated by applying the amplification factors (4, 2, 1) to the third input 4. At step 3, a set of first combined products {0,0,4} is generated by multiplying the third set of binary numbers {0,0,1} to the third set of amplified products {16,8,4}. At step 4, a second set of amplified products {0,0,4} is generated by multiplying the second factor (m=1) to the set of combined products {0,0,4}, which remains the same. At step 5, a third partial product 4 is produced by adding the elements of the third combined product {0,0,4}. At step 6, proceed to step 7 once the computations for the entire three rows (row1, row2, row3) are implemented. At step 7, a total value, 37, is generated as the output of (7×3)+(2×6)+(4×1) by summing the first partial product 21, the second partial product 12, and the third partial product 4.

FIG. 25(b) shows conducting substantially the same operational steps for producing an output of (7×3)+(2×6)+(4×1) as described in FIG. 24(a). At step 1, as operands X, the numbers 7, 2 and 4 are analog inputs (A1, A2, and A3). As operands Y, the numbers 3, 6 and 1 (D1, D2, and D3) are converted to a set of binary numbers (011, 110, 001) to be multiplied. One calculation of X and Y is done in one row, thus, three calculations of elements of X and elements of Y are done through three rows (row 1, row 2 and row 3).

At step 2, a set of first amplified outputs {7, 7, 7} are generated by applying the amplification factors (1, 1, 1) to the first input 7. The amplification factors are determined based on the scaling factor 1 with reference to a location within a single or multi-digit number. Thus, a first bit takes 1, a second bit takes 1 and a third bit takes 1 as the amplification factor. At step 3, a set of combined products {0,7,7} is generated by multiplying the first set of binary numbers {0,1,1} to the first set of amplified products {7,7, 7}. At step 4, a second set of amplified products {0,14,7} is generated by multiplying the second amplification factor (4,2,1) to the first scaled outputs {0, 7, 7}, which remains the same. At step 5, a first partial product 21 is produced by adding each element of the first combined product {0,14,7} together.

According to step 6, at step 2, a first set of amplified outputs {2, 2, 2} are generated by applying the amplification factors (1, 1, 1) to the second input 2. At step 3, a set of combined products {2,2,0} is generated by multiplying a second set of binary numbers {1,1,0} to the first set of amplified products {2,2,2}. At step 4, a second set of amplified products {8,4,0} is generated by multiplying the second factor (4,2,1) to the set of combined products {2, 2, 0}. At step 5, a second partial product 12 is produced by adding each element of the second combined product {8,4, 0} together.

According to step 6, at step 3, a first set of amplified outputs {4, 4, 4} are generated by applying the amplification factors (1, 1, 1) to the third input 4. At step 3, a set of first combined products {0,0,4} is generated by multiplying the third set of binary numbers {0,0,1} to the third set of amplified products {4,4,4}. At step 4, a second set of amplified products {0,0,4} is generated by multiplying the second factor (4,2,1) to the set of combined products {0,0, 4}. At step 5, a third partial product 4 is produced by adding the elements of the third combined product {0,0,4} At step 7, a total value, 37, is generated as the output of (7×3)+(2×

6)+(4×1) by summing the first partial product 21, the second partial product 12, and the third partial product 4.

FIG. 25(c) shows conducting substantially the same operational steps for producing an output of (7×3)+(2×6)+(4×1) as described in FIG. 24(a), except that the accumulator is integrated in each row with implicit scaling factor m=1 (not shown) and without separate accumulator in the end. As operands X, the numbers 7, 2 and 4 are analog inputs (A1, A2, and A3). As operands Y, the numbers 3, 6 and 1 (D1, D2, and D3) are converted to a set of binary numbers (011, 110, 001) to be multiplied. One calculation of X and Y is done in one row, thus, three calculations of elements of X and elements of Y are done through three rows (row 1, row 2 and row 3).

At step 2, a set of first amplified outputs {28, 14, 7} are generated by applying the amplification factors (4, 2, 1) to the first input 7. The amplification factors are determined based on the scaling factor 2 with reference to a location within a single or multi-digit number. Thus, a first bit takes 1, a second bit takes 2 and a third bit takes 4 as the amplification factor. At step 3, a set of combined products {0,14,7} is generated by multiplying the first set of binary numbers {0,1,1} to the first set of amplified products {28, 14,7}. At step 4, a first partial product 21 is produced by adding each element of the first combined product {0,14,7} together.

According to step 6, at step 2, a first set of amplified outputs {8, 4, 2} are generated by applying the amplification factors (4, 2, 1) to the second input 2. At step 3, a set of combined products {8,4,0} is generated by multiplying a second set of binary numbers {1,1,0} to the first set of amplified products {8,4,2}. At step 4, a second partial product 12 is produced by adding each element of the second combined product {8,4,0} together.

According to step 6, at step 3, a first set of amplified outputs {16, 8, 4} are generated by applying the amplification factors (4, 2, 1) to the third input 4. At step 3, a set of first combined products {0,0,4} is generated by multiplying the third set of binary numbers {0,0,1} to the third set of amplified products {16, 8, 4}. At step 4, a third partial product 4 is produced by adding the elements of the third combined product {0,0,4}.

At step 6, proceed to step 8 once the computations for the entire three rows (row1, row2, row3) are implemented. At step 7, a total value, 37, is generated as the output of (7×3)+(2×6)+(4×1) by summing the first partial product 21, the second partial product 12, and the third partial product 4.

What is claimed is:

1. An analog multiplier accumulator array, comprising:
    analog multipliers organized in a matrix of rows and columns,
    one or more than one analog input signal line coupled to an analog multiplier in a row of the array;
    an analog level sensing circuit;
    a set of one or more than one bit line, each bit line electrically connected to an analog multiplier in each column of the row; and
    an analog accumulator configured to connect the set of bit line to the analog level sensing circuit configured to generate digital output signals,
    wherein each analog multiplier comprises an access transistor connected to the analog input signal line and a variable resistor; and
    wherein the analog accumulator comprises:
    an array of metal-oxide semiconductor (MOS) transistors in a row, each MOS transistor connected to a bit line in the set of bit lines; and
    one control line, connected to respective gates of the MOS transistors, configured to activate the MOS transistors such that current flowing in the bit lines connected to the MOS transistors are allowed to be merged in one of the connected bit lines when the MOS transistors are activated.

2. The analog multiplier accumulator array of claim 1, the variable resistor comprising:
    one or more than one flash memory wherein at least one flash memory is configured to connect to a first analog input line and the access transistor has a gate terminal connected to a second analog input line.

3. The analog multiplier accumulator array of claim 1, the variable resistor comprising:
    one read transistor; and
    a pair of coupling transistors configured to have a common floating gate with the read transistor, wherein the pair of coupling transistors are coupled to an input line separate from the analog input signal line connected to the access transistor.

4. The analog multiplier accumulator array of claim 1, further comprising:
    a switching transistor connected to the access transistor in series, the switching transistor having a gate terminal connected to a digital input line.

5. The analog multiplier accumulator array of claim 4, the switching transistor is connected to the variable resistor in series such that the switching transistor enables or disables a flow of current in the bit line to the variable resistor.

6. The analog multiplier accumulator array of claim 5, the variable resistor comprising:
    one or more than one flash memory wherein at least one flash memory is configured to connect to a first analog input line and the access transistor has a gate terminal connected to a second analog input line.

7. The analog multiplier accumulator array of claim 5, the variable resistor comprising:
    one read transistor; and
    a pair of coupling transistors configured to have a common floating gate with the read transistor, one of the coupling transistors is connected to a program word line and the other one of the coupling transistors is connected to a write word line.

8. The analog multiplier accumulator array of claim 7, the program word line is connected to a control gate of one of the coupling transistors and the write word line is connected to the other one of the coupling transistors.

9. The analog multiplier accumulator array of claim 1, the analog accumulator comprising:
    an array of complementary metal-oxide semiconductor (CMOS) transistors in a row, each connected to a bit line in the set of bit lines; and
    a pair of control lines connected to a gate of respective n-channel metal-oxide semiconductor (NMOS) forming each of the CMOS transistor and a second source node is connected to a gate of respective p-channel metal-oxide semiconductor (PMOS) forming each of the CMOS transistor such that currents flowing in the connected bit lines are allowed to be merged in one of the connected bit lines when the NMOS, PMOS, or NMOS and PMOS is activated.

10. An analog multiplier accumulator array, comprising:
    analog multipliers organized in a matrix of rows and columns, one or more than one analog input signal line coupled to an analog multiplier in a row of the array;
an analog level sensing circuit;
a plurality of bit lines, each bit line connected to an analog multiplier in each column of the row; and
an analog accumulator configured to connect the plurality of bit lines to the analog level sensing circuit configured to generate digital output signals,
wherein the analog accumulator comprises a plurality of current mirrors, each of the current mirrors comprising:
a reference p-channel metal-oxide semiconductor (PMOS) transistor comprising a source terminal connected to a voltage supply, a gate terminal connected to a common gate node connected to one of the bit lines, a drain terminal connected to the common gate node,
a drive PMOS transistor comprising a source terminal connected to the voltage supply, a gate terminal connected to the common gate node, a drain terminal directly connected to a common output node; and
wherein a plurality of drain terminals of the drive PMOS transistors are directly connected to the common output node, allowing amplified currents from the drive PMOS transistors to be merged on the common output node.

11. An analog multiplier accumulator array, comprising:
analog multipliers organized in a matrix of rows and columns;
a pair of analog input signal lines coupled to an analog multiplier in a row of the array;
an analog level sensing circuit;
a set of bit lines, each bit line electrically connected to an analog multiplier in each column of the row; and
an analog accumulator configured to connect the set of the bit lines to the analog level sensing circuit configured to generate a digital output signal,
wherein each analog multiplier comprises one pair of differential transistors, a variable resistor, and a switching transistor; and
wherein said analog accumulator comprises:
an array of metal-oxide semiconductor (MOS) transistors in a row, each MOS transistor connected to a bit line in the set of bit lines; and
one control line, connected to respective gates of the MOS transistors, configured to activate the MOS transistors such that current flowing in the bit lines connected to the MOS transistors are allowed to be merged in one of the connected bit lines when the MOS transistors are activated.

12. The analog multiplier accumulator array of claim 11, wherein
a first of the differential transistor has a gate coupled to a first of the paired analog input signal lines, the first transistor being associated to a first of the bit lines; and wherein
a second of the differential transistor has a gate coupled to a second of the paired analog input signal lines, the second transistor being associated to a second of the bit lines.

13. The analog multiplier accumulator array of claim 12, the switching transistor comprises a pair of MOS transistors connected to the pair of differential transistors in series.

14. The analog multiplier accumulator array of claim 12, the variable resistor comprising:
one read transistor, and
a pair of coupling transistors connected to the read transistor in that the pair of coupling transistors have a common floating gate connected to a gate terminal of the read transistor, wherein a common source terminal of the differential transistors is connected to a drain terminal of the read transistor.

15. The analog multiplier accumulator array of claim 12, further comprising a sign selection circuit having four transistors configured in that gate terminals of first and second transistors are connected to one of complementary digital input signal lines and gate terminals of third and fourth transistors are connected to the other of the complementary digital input signal lines, wherein a pair of analog input signals are allowed to be associated to either a pair of the first and second transistors or a pair of the third and fourth transistors.

16. The analog multiplier accumulator array of claim 11, the analog accumulator comprising:
an array of complementary metal-oxide semiconductor (CMOS) transistors in a row, each connected to a bit line in the set of bit lines; and
a pair of control lines connected to a gate of respective n-channel metal-oxide semiconductor (NMOS) forming each of the CMOS transistor and a second source node is connected to a gate of respective p-channel metal oxide semiconductor (PMOS) forming each of the CMOS transistor such that currents flowing in the connected bit lines are allowed to be merged in one of the connected bit lines when the NMOS, PMOS, or NMOS and PMOS is activated.

17. An analog multiplier accumulator array, comprising:
analog multipliers organized in a matrix of rows and columns;
a pair of analog input signal lines coupled to an analog multiplier in a row of the array;
an analog level sensing circuit;
a set of bit lines, each bit line electrically connected to an analog multiplier in each column of the row; and
an analog accumulator configured to connect the set of the bit lines to the analog level sensing circuit configured to generate a digital output signal,
wherein each analog multiplier comprises one pair of differential transistors, a variable resistor, and a switching transistor;
wherein the analog accumulator comprises a plurality of current mirrors, each of the current mirrors comprising:
a reference p-channel metal oxide semiconductor (PMOS) transistor comprising a source terminal connected to a voltage supply, a gate terminal connected to a common gate node connected to one of the set of bit lines, a drain terminal connected to the common gate node,
a drive PMOS transistor comprising a source terminal connected to the voltage supply, a gate terminal connected to the common gate node, a drain terminal connected to a common output node; and
wherein a plurality of drain terminals of the drive PMOS transistors are directly connected to the common output node, allowing amplified currents from the drive PMOS transistors to be merged on the common output node.

* * * * *